United States Patent [19]
Swart et al.

[11] Patent Number: 5,408,189
[45] Date of Patent: Apr. 18, 1995

[54] TEST FIXTURE ALIGNMENT SYSTEM FOR PRINTED CIRCUIT BOARDS

[75] Inventors: Mark A. Swart, Upland; Charles J. Johnston, Walnut; David R. Van Loan, Diamond Bar, all of Calif.

[73] Assignee: Everett Charles Technologies, Inc., Pomona, Calif.

[21] Appl. No.: 990,573

[22] Filed: Dec. 14, 1992

Related U.S. Application Data

[63] Continuation-in-part of Ser. No. 648,453, Jan. 31, 1991, Pat. No. 5,321,351, which is a continuation-in-part of Ser. No. 528,957, May 25, 1990, abandoned.

[51] Int. Cl.6 ............................................. G01R 1/04
[52] U.S. Cl. .................................. 324/758; 356/400; 356/401; 348/87
[58] Field of Search ........ 324/158 F, 158 P, 757–759; 439/482; 358/107; 356/400, 401; 382/8; 33/645

[56] References Cited

U.S. PATENT DOCUMENTS

| | | | |
|---|---|---|---|
| 4,820,975 | 4/1989 | Diggle | 324/158 F |
| 5,150,041 | 9/1992 | Eastin et al. | 324/158 |

Primary Examiner—Kenneth A. Wieder
Assistant Examiner—B. Bowser
Attorney, Agent, or Firm—Christie, Parker & Hale

[57] ABSTRACT

A test fixture for testing circuit boards includes an array of test probes mounted to a probe plate and held in contact with test points in circuits printed on the board. The circuit array is indexed with respect to a fiducial mark on the board. The fiducial mark is sensed, and an optical reading shows the alignment or misalignment of the test points on the board relative to the probes. The top plate position is adjusted to move the board relative to the probes to correct misalignment. The optical reading indicates movement of the board to a corrected position necessary to align the test points to the probes. Board alignment can be optically sensed by a bore scope and an image enlarger and video probe that produce images of the fiducial mark and a known zero reference point on a video monitor. The zero reference is adjustable electronically during calibration. The top plate is movable by X- and Y-axis drive motors coupled to the fixture base and having separate output shafts for shifting the top plate in X, Y and Z-axis orientations. The drive motors are stopped when alignment is made and the top plate is retained in its fixed position during testing of the board.

19 Claims, 17 Drawing Sheets

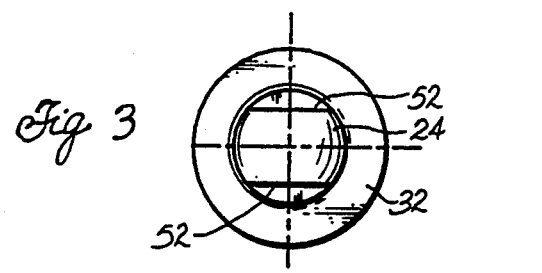
Fig. 3
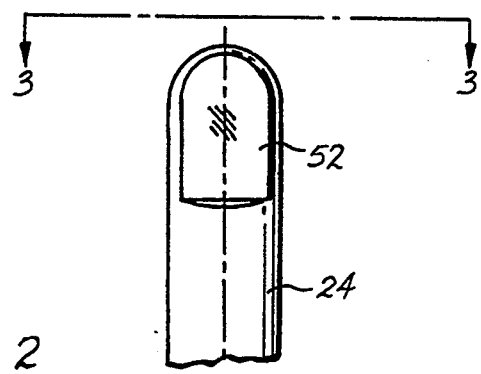
Fig. 2
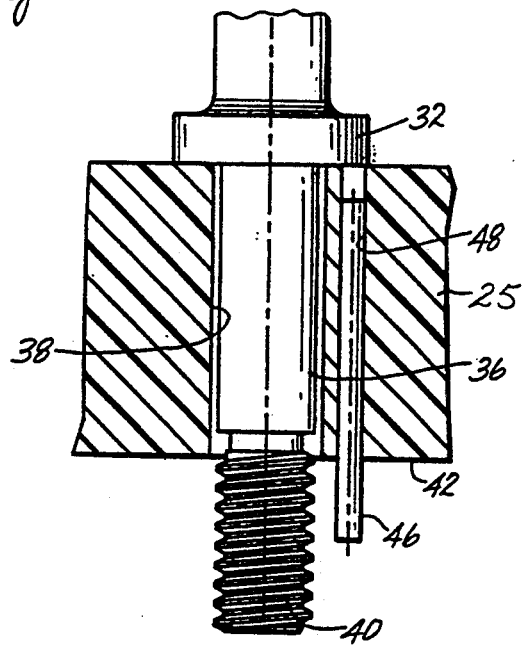
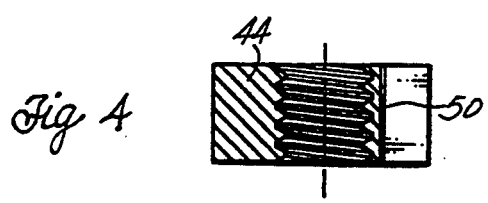
Fig. 4
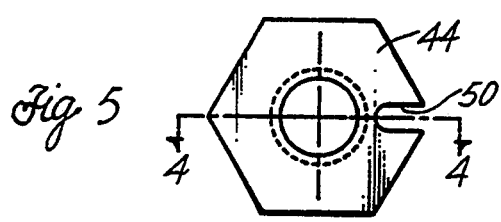
Fig. 5

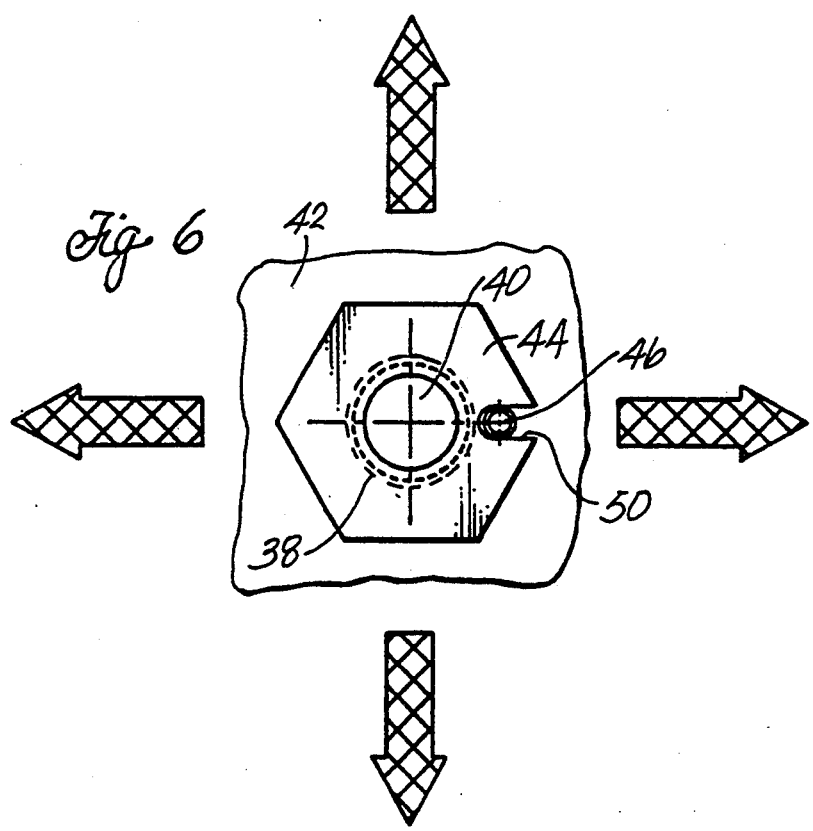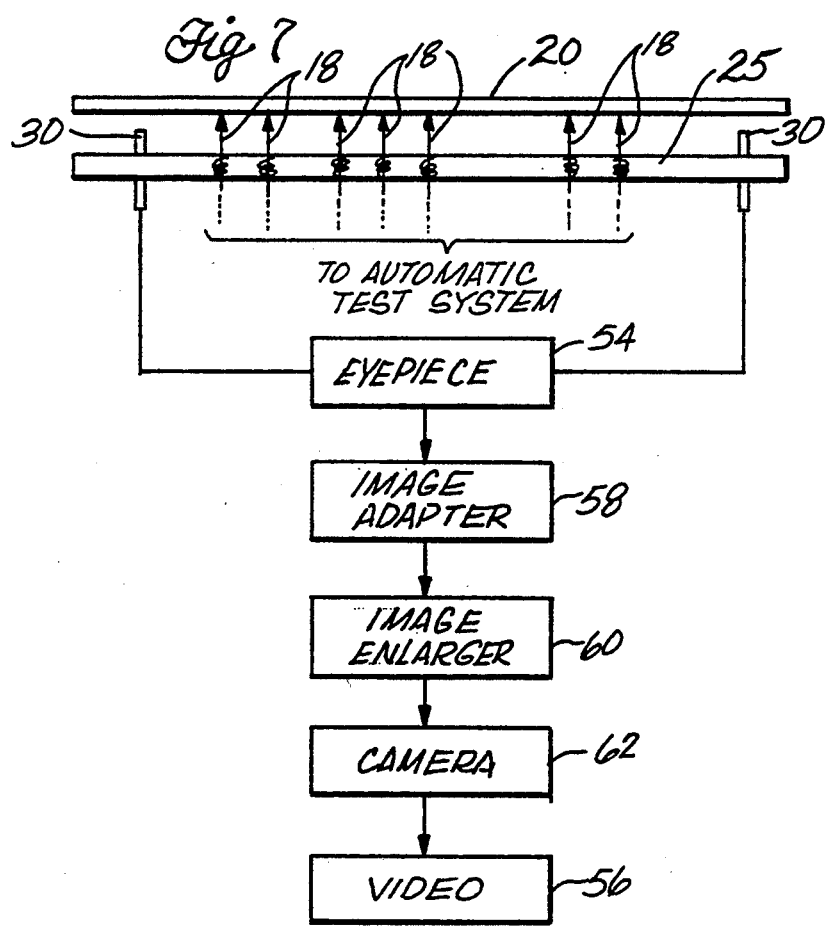

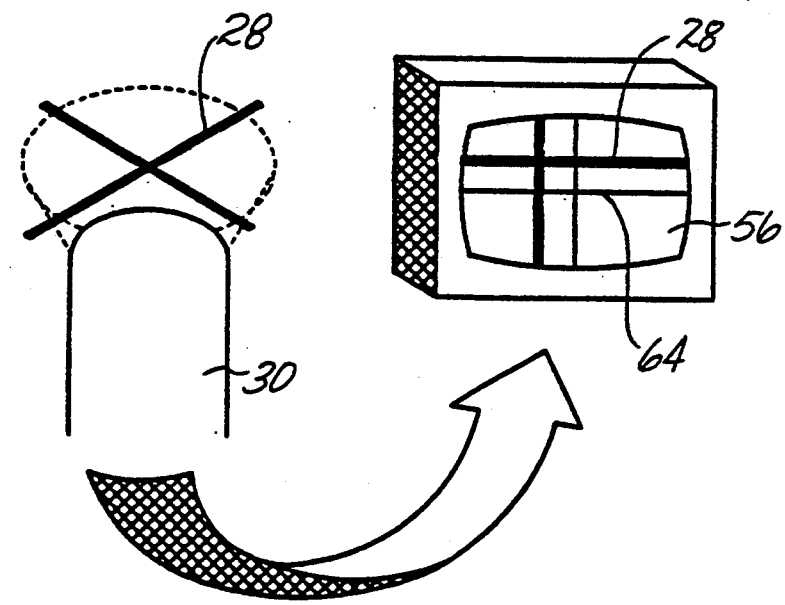

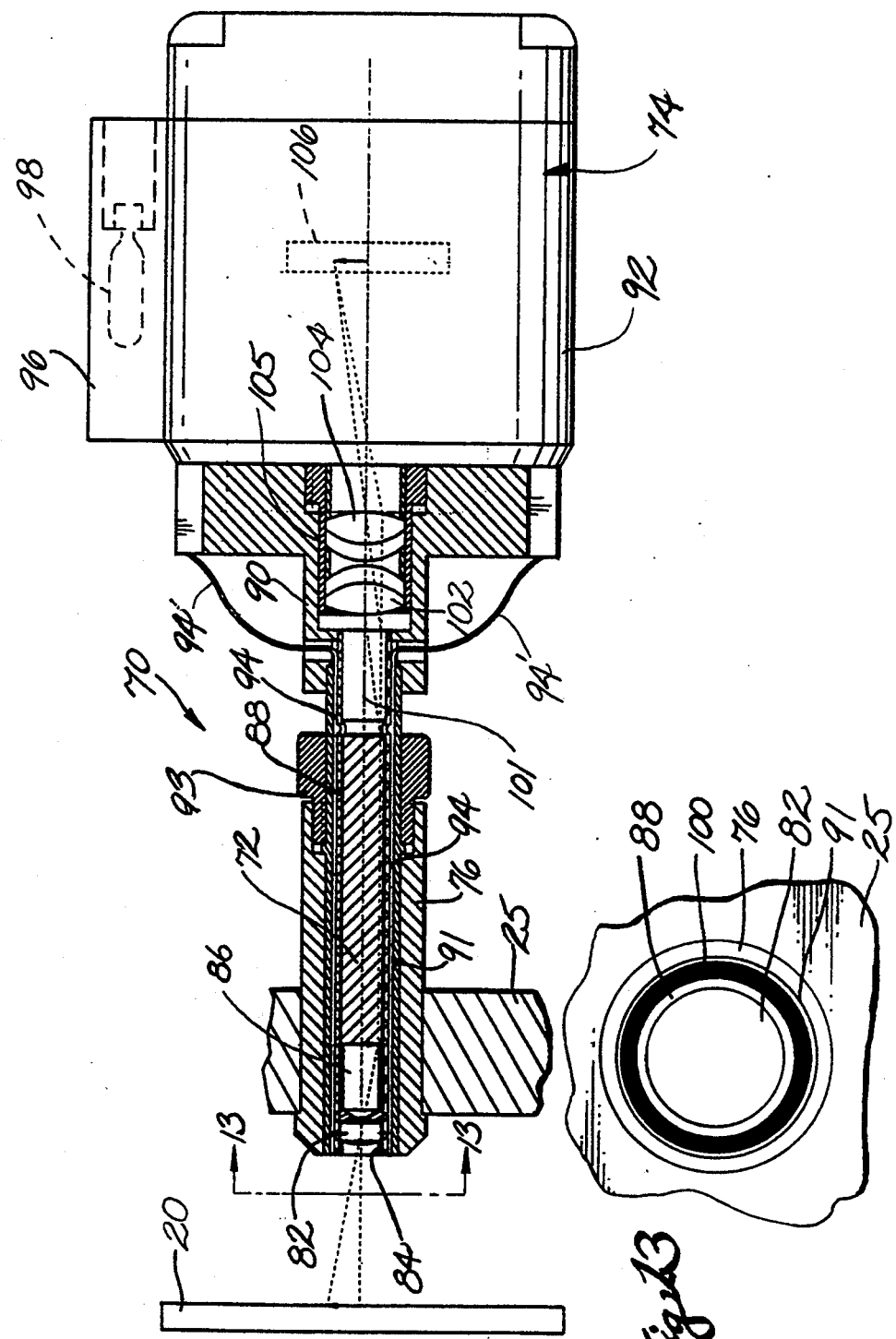

TEST FIXTURE ALIGNMENT SYSTEM FOR PRINTED CIRCUIT BOARDS

CROSS-REFERENCE

This is a continuation-in-part of application Ser. No. 07/648,453, filed Jan. 31, 1991, now U.S. Pat. No. 5,321,351, which is a continuation-in-part of application Ser. No. 07/528,957, filed May 25, 1990, now abandoned.

FIELD OF THE INVENTION

This invention relates generally to the field of automatic test equipment, and more particularly, to a system for aligning printed circuit boards with a test fixture used in the automatic testing of circuit boards.

BACKGROUND OF THE INVENTION

In the automatic testing of printed circuit boards, conventional spring-loaded test probes are typically mounted on a test fixture, and the circuit board under test is held in pressure contact with the spring probes to provide electrical contact between diagnostic or testing equipment and circuits on the board under test. Each test fixture typically contains a base or probe plate having an array of spring probes dedicated to the board under test. Identical circuit boards are then aligned with the fixture and tested, one at a time, to determine whether there are any defects in the circuits printed on each board.

During testing, the spring probes must be correctly aligned with test points in the circuits printed on the board under test. This requires correct alignment of the board on the fixture so that the spring probes are automatically registered with corresponding test points in the circuit array printed on each board. In order to align the board with the probes, the customary practice has been to first drill tooling pin holes in the circuit board. Drilling is done by the board manufacturer, and usually a pair of tooling pin holes are drilled in diagonally opposite corners of the board. During testing, tooling pins in opposite corners of the fixture are positioned in corresponding tooling pin holes to automatically align the board with the array of test probes on the fixture. This procedure requires that the tooling pin holes be drilled accurately in the board by the board manufacturer, so that when each board is later mounted on the tooling pins, the test probes will automatically register with the circuits printed on the board when the test probes are brought into pressure contact with the board during testing.

Printed circuit boards made by a given manufacturer are usually produced in lots, and boards within a given lot will tend to produce a certain misalignment, from tolerance error, when boards within that lot are mounted on a fixture. Alignment tolerances will tend to vary from lot to lot with a given manufacturer. The same board made by a different manufacturer also tends to have different tolerance variations and misalignment errors from lot to lot.

Printed circuit boards typically have a pair of "fiducial marks" printed in the margin of the board at known reference positions relative to the circuit array or "artwork" printed on the board. The fiducial marks are printed on the board by the board manufacturer, and the fiducial marks are used as a guide for the manufacturer's drilling of the tooling pin holes at locations on the board that will automatically align (hopefully) the board to the test probes when the board is mounted on the tooling pins.

There are drawbacks to using these procedures for aligning a printed circuit board with a test fixture. Mechanical tolerances are involved in (1) positioning of the drilling tool in the drilling machine, (2) positioning of the tooling pin holes drilled in the printed circuit board with respect to the artwork on the board, and (3) positioning of the tooling pins on the fixture with respect to the tooling pin holes in the board. Because of these tolerance accumulations, the test probes often do not precisely register with the test points in the circuit array printed on the board. This problem is magnified by tolerance variations in board lots from different manufacturers. The problem also is compounded by advances in the art of printed circuit board technology, where printing of circuits with finer lines and narrower circuit spacings requires more accurate registration of the test probes with the circuits under test. At the present time, for example, it is common for test probes to be misaligned within a range of 0.005 to 0.008 inch in a typical test fixture; more accurate alignment is desirable, and the present invention provides techniques for achieving greater alignment accuracy.

SUMMARY OF THE INVENTION

Briefly, the present invention provides a system for accurately positioning a printed circuit board on a test fixture so that a pattern of test points in a circuit array printed on the board is precisely registered with an array of corresponding test probes on the fixture. Advantages of the alignment system include its ability to produce extremely accurate alignment quickly and easily, low manufacturing costs, reduced time and cost involved in the internal alignment (calibration) of the fixture's system components, and interchangeability with different fixtures.

One embodiment of the invention provides a test fixture for testing printed circuit boards in which the fixture is the type having an array of test probes held in contact with a pattern of test points in a circuit array printed on the board. The circuit array is positioned on the board with reference to a fiducial mark or other reference point on the board. A tooling pin hole or other alignment device on the board is positioned on the board with reference to the circuit array. In one embodiment, the tooling pin hole is positioned on the board with respect to the circuit array, using the fiducial mark as a positioning guide for the drilling tool. The test fixture includes a tooling pin for registering with the tooling pin hole or other alignment device on the board to hold the printed circuit array in a fixed position relative to the test probes on the fixture. The fiducial mark is sensed by sensing means on the fixture for producing an output which represents the alignment or misalignment of the test probes on the fixture with respect to corresponding test points in the circuit array on the board. The position of the tooling pin on the fixture is adjustable to move the board relative to the fixture and thereby correct misalignment of the test probes relative to the circuit array on the board. The sensing means output indicates the amount and direction of movement of the tooling pin and board to a corrected position on the fixture necessary to precisely align the test probes with the circuit array on the board. The tooling pin is then locked or held rigidly in its corrected position for holding the printed circuit board in its properly aligned position on the fixture during testing.

In one embodiment of the invention, the fiducial mark (or any other indexing reference on the board) is sensed by optical sensing means which can comprise a bore scope, an optical fiber image sensor, or a lens system and video probe assembly.

The lens system and video probe may be used with or without the optical fiber image sensor which conveys an image of the fiducial mark to the lens system and video probe. Any optical system which produces an image of the fiducial mark and transmits the image to a remote location for enlargement, such as on a video monitor or other display, can be used.

A visual reading of the alignment or misalignment can be produced by an optical system having means responsive to the optical sensor for producing an enlarged image of the fiducial mark. Display means within the optical system also produce an image of a reference mark that provides a calibrated known zero reference point which, when compared with the enlarged image of the fiducial mark, produces an indication of the alignment or misalignment of the test probes relative to the circuit array on the board. In one embodiment, the zero reference point is adjustable so it can be calibrated into the display system independently of the system optics. During use, the tooling pin and board are moved relative to the fixture, while observing the display images of relative movement between the fiducial mark and the reference mark, so that optical alignment of the two marks precisely registers the test probes on the fixture with corresponding test points in the circuit array on the board.

In one form of the invention, a visual display of the alignment or misalignment of the board is produced by a miniature video camera system mounted to the fixture. Preferably, there are at least two video camera systems mounted below opposite corners of the circuit board. In one embodiment, the video cameras and their image-conveying optical systems are removable from the fixture to enhance interchangeability from fixture to fixture. Each video camera has optical means focused upon a corresponding fiducial mark on the board, and each video camera has its output coupled to a video monitor. A reference index display, preferably obtained from an electronic cross-hair generator or the like, superimposes the reference index on the image of the fiducial mark displayed on the video monitor. The reference index display is set at a calibrated known zero position representing precise alignment of the artwork on the board with respect to the test probe field. Changing the position of the movable tooling pin moves the board, causing the image of the fiducial mark to move on the display relative to the cross-hair. Alignment of the fiducial mark with the cross-hair on the video monitor automatically produces precise alignment of the board to the probe field on the fixture. This calibration is achieved independently of system optics.

In one embodiment, the video camera lens system has a surrounding light source produced by optical fibers for illuminating the fiducial mark on the board being aligned. The camera lens system produces an image of the illuminated fiducial mark which is transmitted by an optical fiber conduit and focusing lens to a video camera and converted to an enlarged video image display, which enhances accuracy of the alignment procedure.

In one form of the invention, the board is mounted to a movable top plate on fixed tooling pins. A bore scope produces an optical reading of the fiducial mark position. X and Y axis drive motors coupled to the top plate move the top plate relative to a fixed probe plate containing the array of test probes. The bore scope image is sent to a remote video display system for enlarging the image of the fiducial mark and displaying it on a video monitor. An electronic cross-hair generator produces a fixed reference mark shown on the video monitor and pre-set by calibration to a known reference board. The X and Y axis motor drives are operated to move the top plate in X,Y and/or Z axis directions to align the video images of the fiducial mark and the fixed reference mark. This automatically aligns the test points on the board with the test probes on the probe plate.

Another form of the invention provides a reference board having artwork representative of circuits on the board under test. This form of the invention avoids use of means for enlarging the image of a fiducial mark or other board reference point. The reference board is preferably first aligned to the test fixture so the artwork on the reference board is perfectly aligned with the array of test probes on the fixture. A board under test then can be overlaid on the reference board to align the artwork on the board under test with the artwork on the reference board. The two boards are then affixed to one another to prevent relative movement between them, and the reference board is then aligned with the fixture. Movable tooling pins on the fixture are moved to a position in alignment with tooling pin holes or other alignment devices on the board under test. The tooling pins are locked, the reference board is removed, and the artwork on the circuit board under test is then automatically aligned with the probe field on the fixture. Circuit boards within the same manufacturer's lot then can be mounted to the fixture for testing, using the adjusted positions of the tooling pins for alignment of the board.

The present invention provides accurate means for aligning the test probes with the circuits on the board such that tolerance accumulations prevalent in the prior art testing procedures are greatly reduced, resulting in greatly improved testing accuracy. The circuit board alignment system also is reasonably inexpensive to manufacture and easily and accurately used by those involved in the testing of circuit boards. Since the zero reference calibration system is independent of system optics, calibration procedures are handled quickly and easily and at a reasonably low cost. The optical system and calibration techniques also are easily interchangeable with different fixtures.

These and other aspects of the invention will be more fully understood by referring to the following detailed description and the accompanying drawings.

BRIEF DESCRIPTION OF THE DRAWINGS

FIG. 2 is a fragmentary cross-sectional view illustrating an adjustable tooling pin mounted on the fixture.

FIG. 3 is a top view taken on line 3—3 of FIG. 2.

FIG. 4 as a cross-sectional view taken on line 4—4 of FIG. 5 and showing a locking nut for the adjustable tooling pin.

FIG. 5 is a top view of the locking nut.

FIG. 6 is a diagrammatic representation of means for adjusting the tooling pin and means for locking the tooling pin with the locking nut.

FIG. 7 is a schematic diagram illustrating components of an optical system for amplifying and displaying means for aligning a circuit board with test probes on the fixture.

FIG. 8 is a schematic representation illustrating visual indications of indexing means for use in aligning the printed circuit board to the fixture.

FIG. 12 is a semi-schematic cross-sectional view illustrating components of a miniature video camera system for imaging test fixture alignment.

FIG. 13 is an elevation view taken along 13—13 of FIG. 12.

DETAILED DESCRIPTION

Figure 1:
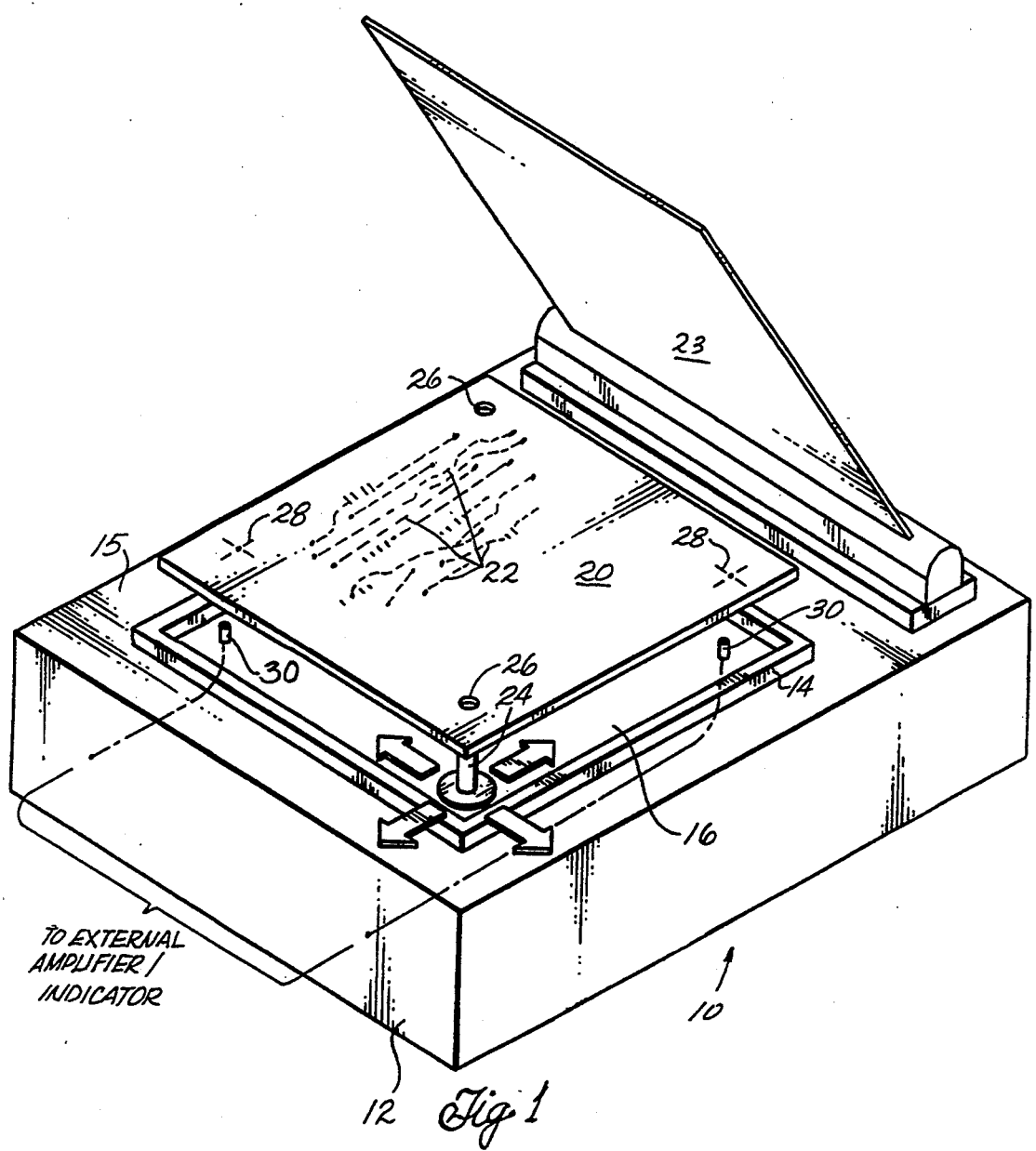
FIG. 1 is a perspective view illustrating a test fixture with an adjustable alignment system according to principles of this invention.
Figure 9:
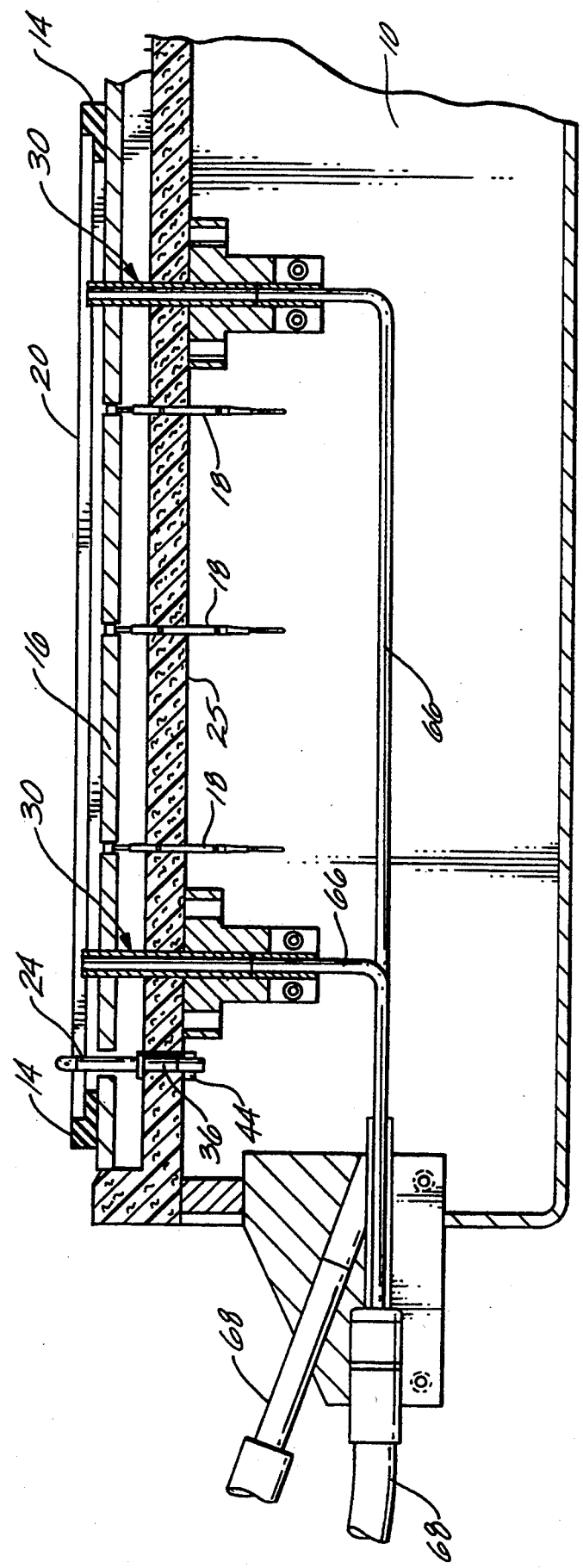
FIG. 9 is a fragmentary cross-sectional view illustrating one embodiment of a test fixture containing an optical test fixture alignment system.
Figure 10:
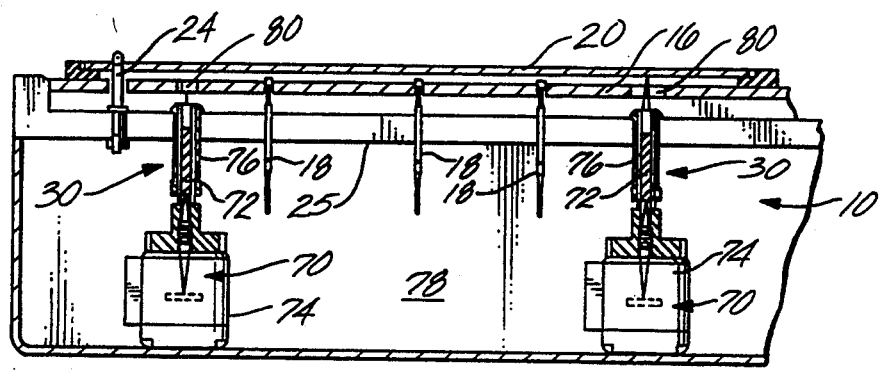
FIG. 10 is a fragmentary cross-sectional view illustrating an alternative embodiment of the test fixture containing a video camera in an optical test fixture alignment system.
Figure 11:
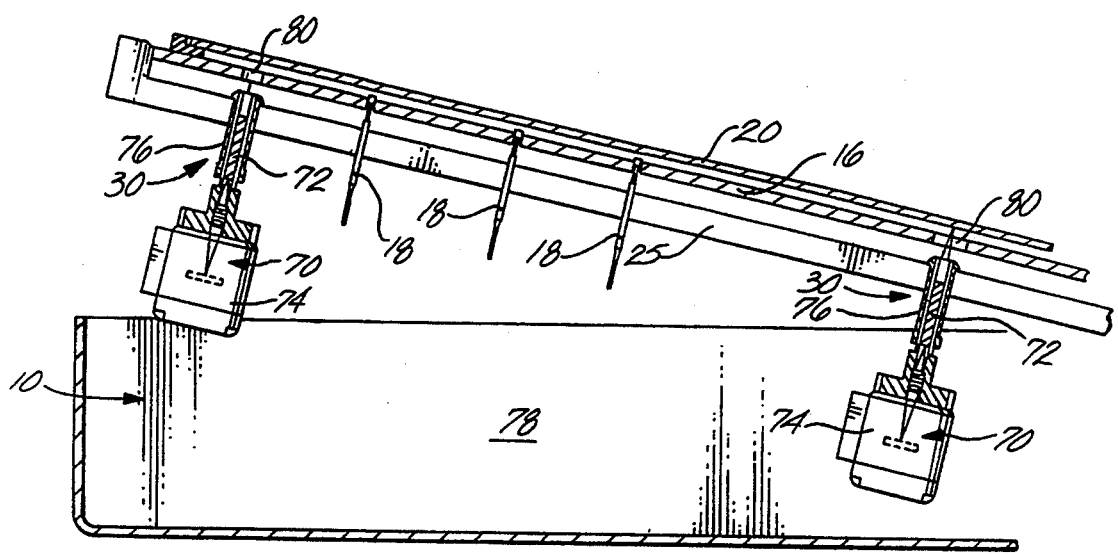
FIG. 11 is a fragmentary cross-sectional view similar to FIG. 10, but showing the fixture rotated to an open position.

FIG. 1 illustrates a test fixture 10 which can represent any test fixture of the type used in the automatic testing of printed circuit boards. In the illustrated embodiment, the fixture includes a housing 12 and a rectangular compressible gasket 14 mounted on an upper face 15 of the housing. The rectangular gasket mounts a circuit board 20 to the fixture and defines the exterior peripheral boundary of a region within the fixture that mounts an array of spring-loaded test probes 18. The probes are represented schematically in FIG. 7 and are also shown in FIGS. 9-11. The test probes are mounted in a desired pattern on a probe plate 25 within the fixture to match the pattern of test points in circuits printed on the circuit board 20 under test. The printed circuit board includes a printed circuit array 22 formed by conventional artwork techniques. In the illustrated embodiment, the circuit array 22 is printed on an underside of the board which faces an array of test probes that project through holes in a movable top plate 16. The gasket 14 is mounted to the top of the moving top plate 16 as shown best in FIG. 9. The moving top plate holds the circuit board 20 parallel the array of test probes. Individual test points within the circuit array 22 on the board are contacted by corresponding test probes during automatic testing of the circuits on the board.

In a preferred test fixture arrangement, the probe plate 25 and the moving top plate 16 are drilled with holes on a pattern that matches the test points in the circuit array on the board under test. The test probes are then mounted in the pattern of holes on the probe plate. The test probes project up through the holes in the moving top plate 16, which is spring-mounted to the probe plate 25. The drilled probe plate and the top plate are dedicated to a particular board under test, and identical circuit boards are tested one-by-one on the fixture. To test a different circuit board, a new probe plate and moving top plate are drilled with a new hole pattern, and a new array of probes are used for testing the board on what otherwise is the same fixture.

Although the invention is described with reference to circuit boards having an array of printed circuits, such as "bare boards" as they are known in the art, the fixture alignment system of this invention also can be used for testing "loaded circuit boards" to which circuit components, such as integrated circuit packages and the like, are mounted.

Once the printed circuit board 20 is mounted on the fixture, a hinged door 23 is closed over a cavity containing the circuit board, and vacuum pressure is applied to resiliently bias the spring probes into contact with corresponding test points in the circuit array printed on the board, in a manner familiar to those skilled in the art. A typical means of applying pressure can be through vacuum applied to the cavity to seal the board 20 to the gasket 14 during testing. The vacuum draws the board and the moving top plate 16 down toward the array of test probes 18 on the probe plate 25. Continuity or lack of continuity between the various test points in the electrical circuits on the board are detected by an external electronic test analyzer (not shown) electrically coupled to the test probes for use in measuring whether the circuit board is functional or for identifying defective circuits.

During testing, a pair of movable tooling pins 24 mounted in diagonally opposite corners of the probe plate 25 are registered with corresponding tooling pin holes 26 drilled in diagonally opposite corners of the circuit board 20. (Only one of the movable tooling pins is shown in FIG. 1; the other is obscured by the printed circuit board.) By positioning the tooling pins in the tooling pin holes, the board is mounted in a fixed position parallel to the fixture base, so that the test points in the circuit array 22 can be automatically aligned with corresponding test probes 18 for testing the circuits on the board. Use of tooling pins inserted in the tooling pin holes is one example of a means for mounting the board to the fixture. Alternatively, tooling pins on the fixture can be engaged with other alignment devices on the board to hold the board in a fixed position as the fixture. On example is a tooling pin with a right angle recess that engages a right angle corner of a board. Other means of aligning the board to the fixture are possible.

As mentioned previously, the tooling pins do not necessarily produce the desired precise alignment. The tooling pin holes are drilled in the board by the board manufacturer. Fiducial marks 28 are printed on the board by the board manufacturer, and these marks, shown in diagonally opposite corners of the board, provide a known reference point or indexing mark with respect to the artwork printed on the board. (The fiducial marks shown on the top side of the board in FIG. 1 are actually visible from the underside of the board.) The board manufacturer aligns the drilling tools with respect to the artwork on the board, using the fiducial marks as a reference, and the tooling pin holes are positioned (drilled) on the board with reference to the fiducial marks. However, in practice, mechanical tolerance accumulations are generated from positioning the board in the drilling machine, positioning the drilling tools in the drilling machine, drilling the tooling pin holes, and registering the tooling pins on the fixture with the drilled tooling pin holes. Thus, the tooling pin holes drilled in the board may not precisely register the spring probes with the artwork on the board when the tooling pins are inserted in the tooling pin holes and the board is brought into pressure contact with the probes.

The fixture 10 provides means for overcoming the drawbacks of the conventional practice of aligning a circuit board under test with a test fixture. The fixture 10 includes an alignment system having a means for movably positioning the tooling pins 24 on the probe plate 25, together with sensors 30 on the probe plate for use in sensing the position of the fiducial marks 28 on the board under test. The movable tooling pins allow the board to be moved manually relative to the probe field on the fixture. The sensors detect movement of the fiducial marks as the printed circuit board is moved into alignment with the probe field, and an enlarged image of each fiducial mark is displayed to assist in precise manual alignment of the board to the probes on the fixture. The fiducial marks are sensed by the sensors 30, and images of the marks are produced and are observable in relation to an image of a corresponding known zero reference point used as a reference index in an optical alignment and display system. The tooling pins 24 are manually movable to move the board while observing corresponding movement of the fiducial mark on the display, so the board can be moved to accurately align each fiducial mark 28 with a displayed reference point. This movement automatically positions the test points in the circuit array 22 in precise alignment with corresponding spring probes on the fixture base. FIGS. 2 through 6 illustrate a preferred system for adjustably mounting the tooling pins to the fixture base. Separately, the sensors 30 are mounted in fixed positions on the fixture base in diagonally opposite corners and in alignment with the fiducial marks 28 or any other indexing marks of the board under test. The sensors 30 and the reference indexing and optical alignment system are described in more detail below.

Referring now to FIGS. 2 through 6, adjustment of the tooling pin positions will now be described. Each tooling pin 24 comprises a rounded upright board-locating pin with an enlarged rounded base 32 having a flat annular bottom surface 34. The diameter of the tooling pin matches the diameter of the tooling pin hole drilled in the board so the board can be positioned on the tooling pin. An elongated cylindrical shank portion 36 of a pin fastening member extends downwardly from the underside of the rounded base 32. The shank has an outside diameter similar to the outside diameter of the tooling pin, and the axis of the shank is aligned with the vertical axis through the tooling pin. The shank is positioned in a mounting hole 38 in the probe plate or fixture base 25. The mounting hole is oversized relative to the outside diameter of the shank, so the shank portion of the locating pin can have 360° freedom of movement within the fixture hole. During this movement, the rounded base 32 of the locating pin completely covers the hole and provides a support base for holding the tooling pin at all times in a vertical upright position. The bottom of the pin fastening member has an externally threaded section 40 that projects down from a bottom face 42 of the fixture base. The tooling pin is held in place in the fixture base by an internally threaded locking nut 44 tightened onto the externally threaded bottom section 40 of the fastening system. By rotating the locking nut onto the projecting bottom portion of the fastening member during assembly, the tooling pin can be held in a fixed orientation with respect to the top plane of the fixture base.

During assembly, and after the locking nut has been tightened against the bottom face of the fixture, a dowel pin 46 is then placed in a narrow passageway 48 in the fixture bottom adjacent the shank portion 36 of the tooling pin 24. The dowel pin is preferably adhesively bonded or otherwise rigidly affixed in the passageway to hold the dowel pin in a fixed position, with a lower portion of the dowel pin projecting from the bottom face 42 of the fixture base, adjacent the locking nut 44. The projecting lower portion of the dowel pin is contained within a narrow recess 50 in the locking nut. The tooling pin 24 is movable relative to the fixture base by engaging the flats on a wrench (not shown) with flats 52 at the top of the tooling pin, and by turning the wrench to rotate the tooling pin about its axis. This loosens the tooling pin from its fastened connection to the locking nut and allows the entire tool pin assembly to be moved in any direction within the hole 38 relative to the fixture base. Once the tooling pin has been moved to a desired position, the tooling pin then can be locked to the base by turning the tooling pin, using the wrench applied to the flats 52 from access provided above the fixture base. The dowel pin 46 engages the recess 50 in the locking nut 44 to prevent rotation of the locking nut as the tooling pin is being tightened to its locked position. The upper portion of the tooling pin 24 extends through an oversized hole in the top plate 16 (see FIGS. 9 and 10) so the tooling pin can be moved on the fixture base (probe plate 25) without moving the top plate when the board is moved.

Alignment of the printed circuit board to the array of test probes will now be described. The sensors 30 comprise any type of sensing device that can sense the location of the fiducial marks 28 on the board and provide an output signal representative of the sensed position of the fiducial marks. Since the fiducial marks are printed at known reference positions relative to the artwork printed on the board, the fiducial marks provide a precise reference point with respect to the locations of the test points within the circuit array printed on the board. The sensors 30 preferably comprise optical sensors which optically sense the positions of the fiducial marks and produce an output which is processed by an external image enlarger and display system that amplifies and displays enlarged images of the positions of the fiducial marks relative to corresponding known zero reference points which are also displayed.

In a preferred alignment technique, a known zero reference is first established. Preferably, a reference board known as a "gold board" is used to set the zero reference. The gold board is a replica of a printed circuit board having its fiducial marks (or other indexing marks) perfectly set to positions on the board with reference to the position of the artwork on the board. The gold board preferably has two fixture pins, referred to as "gold pins," in its opposite corners to represent the perfectly set fiducial marks. The gold board also has fixed tooling pins positioned on the gold board for perfect alignment of the gold board to the fixture. The gold board is mounted on the fixture by inserting the tooling pins of the gold board into fixed tooling pin holes on the fixture, which correctly aligns the gold board to the fixture. This produces perfect alignment of the fiducial marks (the gold pins) on the gold board with the fixture and its probe field. (The gold board has clearance holes for receiving the movable tooling pins 24 so the gold board can be mounted to the fixture independently of the location of the tooling pins 24. No circuits are printed on the gold board since the gold board is used only for alignment purposes.) The sensors 30 are then used for sensing the positions of each gold pin and displaying an enlarged image of the gold pin on a display or monitor. The images of the gold pins are preferably displayed on separate monitors, although they could be displayed together on one monitor. Separately, a cross-hair generator is used to form a cross-hair image on the display to represent a perfect zero alignment of the board to the fixture. A separate cross-hair image is superimposed over the image of each gold pin displayed on the monitor. The optical sensing system is then aligned to the gold pins on the gold board using the images displayed on the monitor. The gold board remains fixed with respect to the fixture and the images of the cross-hairs are moved electronically until each cross-hair registers perfectly with the enlarged image of a corresponding gold pin displayed on the monitor. This precisely aligns the image display system to each fiducial mark (the gold pins) on the gold board, so that the settings of the cross-hair zero points represent perfect alignment of the artwork on the circuit board related back to the probe field on the fixture. The gold board is then removed from the fixture. Thereafter, circuit boards placed on the fixture tooling pins are aligned with the zero-tolerance-error reference points represented by the images of the cross-hairs on the monitor. When a circuit board is first placed on the fixture, any misalignment of the artwork relative to the probe field is represented by a misalignment of each fiducial mark relative to its corresponding cross-hair zero point that represents zero tolerance error. The movable tooling pins are then loosened, the board is moved manually, and the monitor is observed to align each sensed fiducial mark with its corresponding cross-hair reference. This automatically and precisely aligns the artwork on the board to the array of probes on the fixture.

The separate calibration board (gold board) and electronically adjustable cross-hair generator calibrate alignment of the fixed zero reference point to the fiducial mark imaging system, independently of system optics. This greatly reduces the cost of the alignment system when compared with a system in which the fixed reference is built into a lens system for imaging the fiducial mark.

The optical sensors 30 can be in various forms. In one embodiment, each sensor may comprise an optical fiber sensor. (Other sensing devices are described below.) A preferred optical fiber sensor comprises a coaxial optical fiber sensor having a monofilament optical fiber core, and a separate outer optical fiber tube made of a bundle of tiny optical fibers positioned around the periphery of the core. The monofilament optical fiber core can act either as a light emitter or receiver, and the outer peripheral optical fiber tube acts as the receiver for the emitter or vice versa. The emitter and receiver are insulated from each other, and an external imaging system sends a signal to one optical fiber conduit which produces an optical signal that reflects off the board. The other optical fiber conduit picks up the reflection from the board. The optical signal passes the fiducial marks and produces one type of reflection, whereas when the optical signal is centered on the fiducial marks, the reflections are interrupted and a different reflected light signal is sensed. Thus, the optical fiber and its imaging system acts as a transceiver to detect one type of light signal when there is misalignment with the fiducial mark and another type of light signal when alignment is produced.

Alternatively, the optical sensing device of the optical fiber type can comprise a pair of side-by-side optical fibers for emitting and receiving light signals to detect the position of the fiducial marks.

FIG. 9 illustrates another embodiment of a sensor 30 which comprises a pair of fiber optic probes 66 mounted to a fixture in alignment with fiducial marks on the board 20. The fiber optic probes are preferably flexible image conduits each comprising as many as 80,000 pixels, to transmit an image of the fiducial mark to the exterior of the fixture for further processing. The fixture in FIG. 9 also shows flexible optical fiber image conduits 68 transmitting images to remote display systems. In aligning the printed circuit board 20 to the fixture, the board is mounted on the tooling pins 24. The fiber optic probes 66 can be spring biased for spring-pressure contact with the underside of the board, or they can be used in combination with a lens system to focus on the fiducial marks on the board under test. Each of the tooling pins 24 is loosened, allowing the board to be moved manually relative to the fixture base and probes 18. This moves each fiducial mark relative to its corresponding optical sensor 30. Preferably, alignment is carried out by adjusting the position of one tooling pin until its related fiducial mark is properly aligned with a corresponding cross-hair (zero tolerance error reference point) on the monitor, and then adjusting the position of the other tooling pin to move its related fiducial mark into alignment with its related cross-hair. The external optical position detecting and imaging system can include retroreflective optical sensors for receiving external light signals conducted by the fiber optic probes. The underside of the board under test can be covered by a solder mask that reflects a given color of light picked up by the optical fiber sensors. The fiducial marks can be visible through the solder mask. The optical sensors on the external unit receive an external optical signal which is displayed in one color on the screen of a monitoring device from light reflected from the solder mask. When the fiducial marks are sensed by the optical fiber sensors (from movement of the board into the proper alignment position), the optical light signals change to a different color indicating alignment of the optical sensors with the respective fiducial marks. Alignment of each fiducial mark with a corresponding optical sensor is indicated on the imaging system, after which each tooling pin on the fixture is locked in a fixed position on the fixture base, for holding the board in its correctly aligned position.

In an alternative imaging system, a fiber optic probe 66 focuses on a fiducial mark and the opposite end of each optical probe is plugged into a second camera lens system used in displaying the fiducial mark on a remote monitor.

In another form of the invention, each optical sensor 30 can comprise a corresponding bore scope for producing a visual image of the location of the fiducial marks 28 relative to a known indexing mark produced by the external optical detecting and imaging system. The bore scope can be a type of optical detector using a matrix of optical fibers similar to pixels that form an image of an object in the field of view of the bore scope sensor. The bore scope is set at a fixed distance from the underside of the board because it has a fixed focal length lens to focus the light reflected from its field of view.

To properly align the board with the fixture, the board is placed on the tooling pins so that the board can be held at the correct set distance from each bore scope or other focusing optical device. The tooling pins are loosened at first so that the board can be moved manually relative to the fixture when the bore scope or other optical device is used for sighting the fiducial marks on the board. (The rectangular gasket 14 on which the board rests has sufficient clearance to allow shifting of the board relative to the top plate 16 and the probe field.) The board is then aligned using the imaging system which is best understood by referring to FIGS. 7 and 8. Each fiducial mark 28 is viewed through an eyepiece 54 which displays a cross-hair or other fixed zero reference indication generated in the optical display system. When the board is moved to position the fiducial mark close to the field of view, the bore scope or other optical device picks up the image of the fiducial mark which can be viewed in the eyepiece in reference to the fixed zero reference mark. The fiducial mark and the fixed reference mark can be enlarged and displayed on the screen of a video monitor 56 for use in accurately positioning the board on the fixture. The image enlarging and display system can include an image adapter 58 which senses the visual output from each eyepiece and adapts the images from both bore scopes into a display showing each fiducial mark in relation to its corresponding fixed zero reference cross-hair. The output from the image adapter is applied to a video enlarger 60 for enlarging the image of each reference cross-hair with its corresponding fiducial mark. An external camera 62 receives the image enlarger output for transmission to the video display terminal 56. FIG. 8 illustrates the video output on a screen of the video unit 56 which includes the enlarged image of a fiducial mark 28 detected by the optical sensor 30 in relation to a fixed zero reference cross-hair 64 in the imaging system.

By moving the circuit board relative to the fixture via the movable tooling pins, the position of each fiducial mark can be aligned with respect to its corresponding fixed reference mark 64. The screen of the video unit 56 can be observed as each tooling pin is manually moved through its 360° freedom of rotation until the fiducial marks on the board and the two sets of cross-hairs are properly registered. Each tooling pin is then locked in place on the fixture to automatically and precisely align the test points of the circuit array on the board with the test probes 18 on the fixture. The display shown in FIG. 8 is duplicated on a separate monitor for each fiducial mark and its related zero reference cross-hair. The board is moved while simultaneously monitoring all displays until all fiducial marks are aligned.

There are several possible means for setting the imaging system's fixed reference mark (the cross-hair 64) at a known zero position that will automatically align the test probes with the circuit array on the board when the image of the fiducial mark on the board is aligned with the image of the cross-hair reference. The preferred procedure is to use the calibration board, also referred to previously as a "gold board," which represents a zero alignment error when mounted to the test fixture. The gold board generates a zero alignment error with the test probes when tooling pins at diagonally opposite corners of the gold board are fitted into corresponding holes located on the test fixture at known fixed positions relative to the probe field. The external imaging system contains an electronically adjustable cross-hair generator to align separate cross-hairs with the reference marks or pins on the gold board so that zero alignment error is produced within the imaging system. This zero tolerance error is then calibrated electronically into the cross-hair imaging system. During testing, the gold board is replaced with each board under test, and enlarged images of the fiducial marks on a board being tested are displayed. The tooling pins on the fixture are loosened and each board is then moved to a position that will align its fiducial marks with the fixed reference cross-hairs set by the calibration system, to automatically align each board to the probe field on the fixture.

The image adapter is preferably arranged to display each tooling pin position reference with respect to a corresponding fiducial mark, as depicted in FIG. 8, in which case a separate monitor is used for each fiducial mark alignment; or a split screen arrangement can be used in which both sets of reference cross-hairs and fiducial marks are displayed on one screen.

FIGS. 10 and 11 illustrate a further embodiment of an optical sensor and alignment system in which each optical sensor 30 comprises a separate miniature camera lens and video probe assembly 70 mounted to the fixture, adjacent the probe field, for viewing toward the board under test. The separate camera lens and video probe assemblies each are removably mounted to the fixture base. Each assembly includes a lens, optical fiber image conduit, light source, video camera, image enlarging lens and connection to an external video monitor, all of which are removable from the fixture base. This arrangement enhances interchangeability with other fixtures.

Each camera lens and video probe assembly 70 includes a narrow cylindrical camera lens and optical fiber image conduit 72 mounted to a video camera 74. The image conduit 72 is comprised of a bundle of thousands (in one embodiment, 80,000) pixels or optical fibers in a manner similar to the optical probes 66 described previously. The lens and image conduit 72 are mounted in an elongated tubular video probe receptacle 76 affixed to the fixture base 25. The camera lens, optical conduit and video probe assembly extends downwardly under the base 25 of the fixture and into a hollow interior region 78 of the fixture housing. The camera lens, optical conduit and video probe assemblies mount to diagonally opposite corners of the base for alignment with corresponding fiducial marks on the underside of the board under test. The optical fiber image conduit 72 of each video probe and its corresponding lens are aligned with a separate enlarged hole 80 in opposite corners of the probe panel 16, for focusing on corresponding fiducial marks on the board. FIG. 11 illustrates how the fixture base 25 can pivot to an open position to gain access to the hollow interior region 78 of the fixture housing for mounting the camera and video probe assemblies in the receptacles 76 affixed to the base.

The fixturing arrangement shown in FIGS. 10 and 11 represents one embodiment in which the camera lens and video probe assemblies 70 are mounted inside the fixture housing, below the circuit board under test. The fixturing arrangement shown in FIG. 9 represents an alternative embodiment in which the camera lens and video probe assemblies may be remotely located from the fixture (because of space limitations), in which case the flexible optical fiber image conduits extend remotely away from the fixture for coupling to corresponding camera probes.

FIGS. 12 and 13 best illustrate the detailed construction of the camera lens and video probe assembly 70. The front of the optical fiber image conduit 72 has a double convex lens assembly 82 mounted in an opaque shield tube 84. A steel tube spacer 86 mounted behind the double convex lens provides an F-stop for the lens in focusing the image on the optical fiber image conduit. The lens assembly and optical fiber image conduit are mounted in an upright opaque lens tube 88 held in an opening through a lens mount 90 at the front of a video camera housing 92. The outer lens tube 91 carries a lock nut 93 used for in removably mounting the lens and video probe assembly to the video probe receptacle 76 on the base. (Alternatively, the receptacle that holds the video probe to the fixture can removably snap-lock into position, with a detent that automatically orients the optical system rotationally so that movement of the board is translated into corresponding movement of the fiducial mark on the monitor.) The tubular receptacle 76 on the fixture base contains a tubular opaque fiber optic conduit 91 which surrounds and parallels the long lens tube 88. The two tubes are coaxially aligned, leaving an open annular space between the inner tube 82 and the tubular outer fiber optic conduit 91. A plurality of flexible optical fibers 94 (in one embodiment, 56 separate optical fibers) extend through the annular space inside the conduit 91, from near the front of the lens tube to a lamp housing 96 on the video probe housing 92. A lamp 98 is mounted in a lamp holder in a cavity in the housing 92. The optical fibers 94 are directed from the annular space within the coaxial tubes into the cavity within the lamp housing for illumination from the light source. This is represented schematically at 98 in FIG. 12. The optical fibers 94 transmit the light from the lamp to the tip of the camera lens for forming an optical fiber ring 100 (see FIG. 13) which surrounds the lens system of the camera. The optical fiber ring produces a source of illumination for lighting the surface of the board 16, which can be a board under test or the gold board used for calibrating fixture alignment. The camera lenses 82 focus on the fiducial mark and produce an enlarged image of the fiducial mark on the optical fiber image conduit, along an optical axis 101 through the camera lens tube 88. Alternatively, the optical fiber image conduit 72 can be replaced with a relay lens system for optically transmitting an image of the fiducial mark to the video camera.

Figure 14:
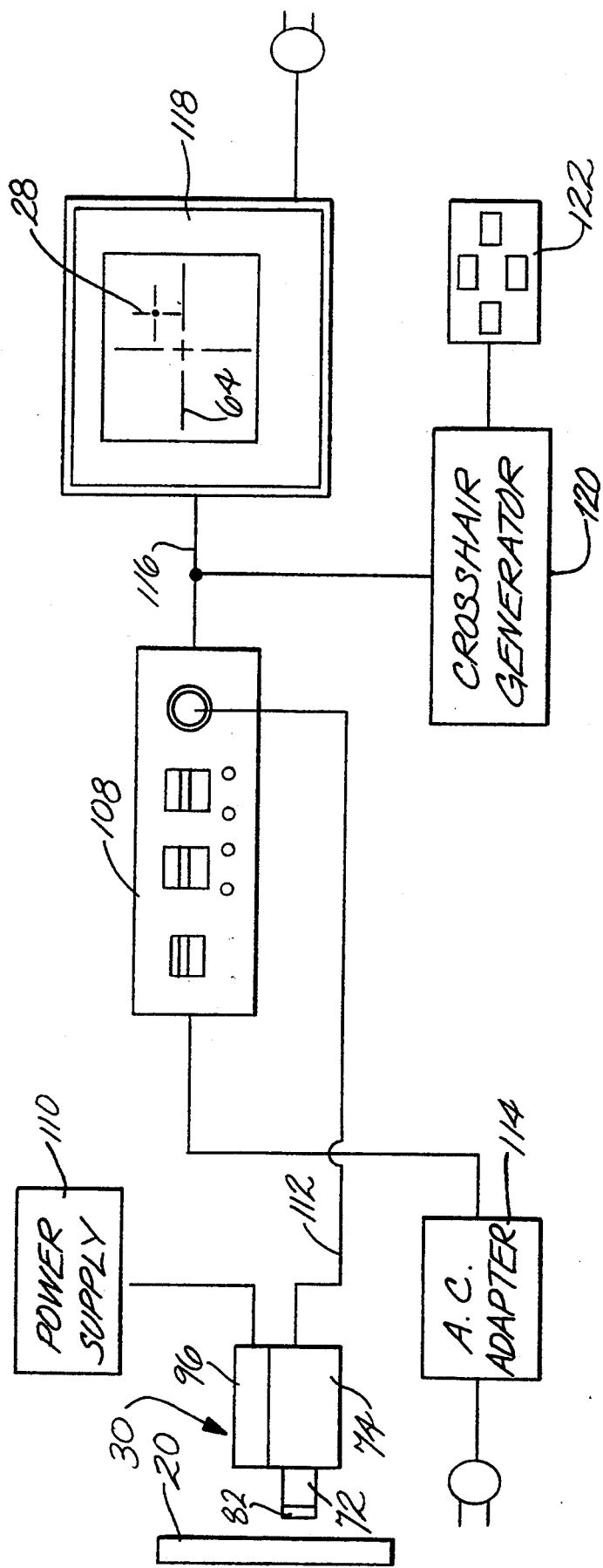
FIG. 14 is a schematic functional block diagram illustrating electronic components of the test fixture alignment imaging system.

The video probe 74 includes a pair of lenses 102 and 104 mounted in a tube 105 on the optical axis 101 extending from the opening to the camera lens assembly, through the optical fiber image conduit 72 and lens mount 90, and into the housing 92 of the video camera. The tube 105 is threaded for adjusting the position of the lenses on the lens mount 90 to control the distance between the camera lens 82 and the lenses 102 and 104. The lenses 102 and 104 in the video camera comprise an achromatic lens and a lens to correct for color aberrations. The lens pair receive the enlarged image of the fiducial mark from the optical fiber image conduit and produce an essentially 1:1 image focused on a charge-coupled device (CCD) chip 106 contained in the video probe unit. The CCD chip converts the image from the video lenses into digital information processed by a video display system shown in FIG. 14. The digital signals from the CCD chip are sent to a camera controller unit (CCU) 108 shown in FIG. 14 which also schematically illustrates the camera lens 82 and optical fiber image conduit 72, the video camera 74, and the fiber optic lamp housing 96 with a power supply 110 powering the fiber optic light source. A camera cable 112 transmits digital signals from the CCD chip in the video camera to the camera controller unit (CCU) 108. The video CCU 110 can be a unit such as the EC-202 or EM-102 sold by Elmo of Japan. The CCU is powered by a conventional AC power source through an AC adapter 114 such as the Elmo AC-E12 adapter. A coaxial video cable 116 from the CCU transmits video signals to a TV monitor 118. The camera lens and video probe produce an enlarged image of the fiducial mark 28 on the display screen of the TV monitor 118. Separately, the output of a cross-hair generator 120 is electronically coupled to the video cable 116 for superimposing a video image of the cross-hair 64 on the TV monitor. A cross-hair position controller 122 controls the position of the cross-hair on the monitor. The video camera and display system illustrated in FIG. 14 is repeated for each separate reference point or fiducial mark sensed on the circuit board. This arrangement includes a separate TV monitor for each video probe. Separately, a split screen can be used to simultaneously display fiducial marks and their related cross-hair reference.

In using the video camera system for aligning a circuit board to the probe field on the fixture, the fixture is first calibrated with the gold board. The video cameras are powered, and the video system produces enlarged video images of the gold pins that represent each one of the gold board's fiducial marks. Each cross-hair display is adjusted until the video images show the gold pins in alignment with the cross-hairs displayed on the monitors. The gold board is then removed, and circuit boards are tested one at a time on the fixture, with each fiducial mark on the board being displayed on a video monitor. If a fiducial mark is misaligned relative to its cross-hair image, the tooling pin positions are simply adjusted while moving the board relative to the probe field until the fiducial mark images come into alignment with the cross-hairs. The board is then precisely aligned to the probe field on the fixture.

The video camera alignment system produces a highly accurate means of adjusting circuit boards because alignment can be done rapidly. Since very minute position adjustments of the board are translated into greatly enlarged visual image position adjustments, board alignment is highly accurate. The miniature video camera assemblies can be part of a basic fixturing system which includes the fixture housing and the video display and monitor. Only a new probe plate and top plate need to be drilled for each board being tested, along with forming a gold board to calibrate the alignment. The camera assemblies then mount to the receptacles in the probe plate. The entire lens and video probe system for forming an enlarged image of the fiducial mark is removed from or mounted to the base.

Figure 15:
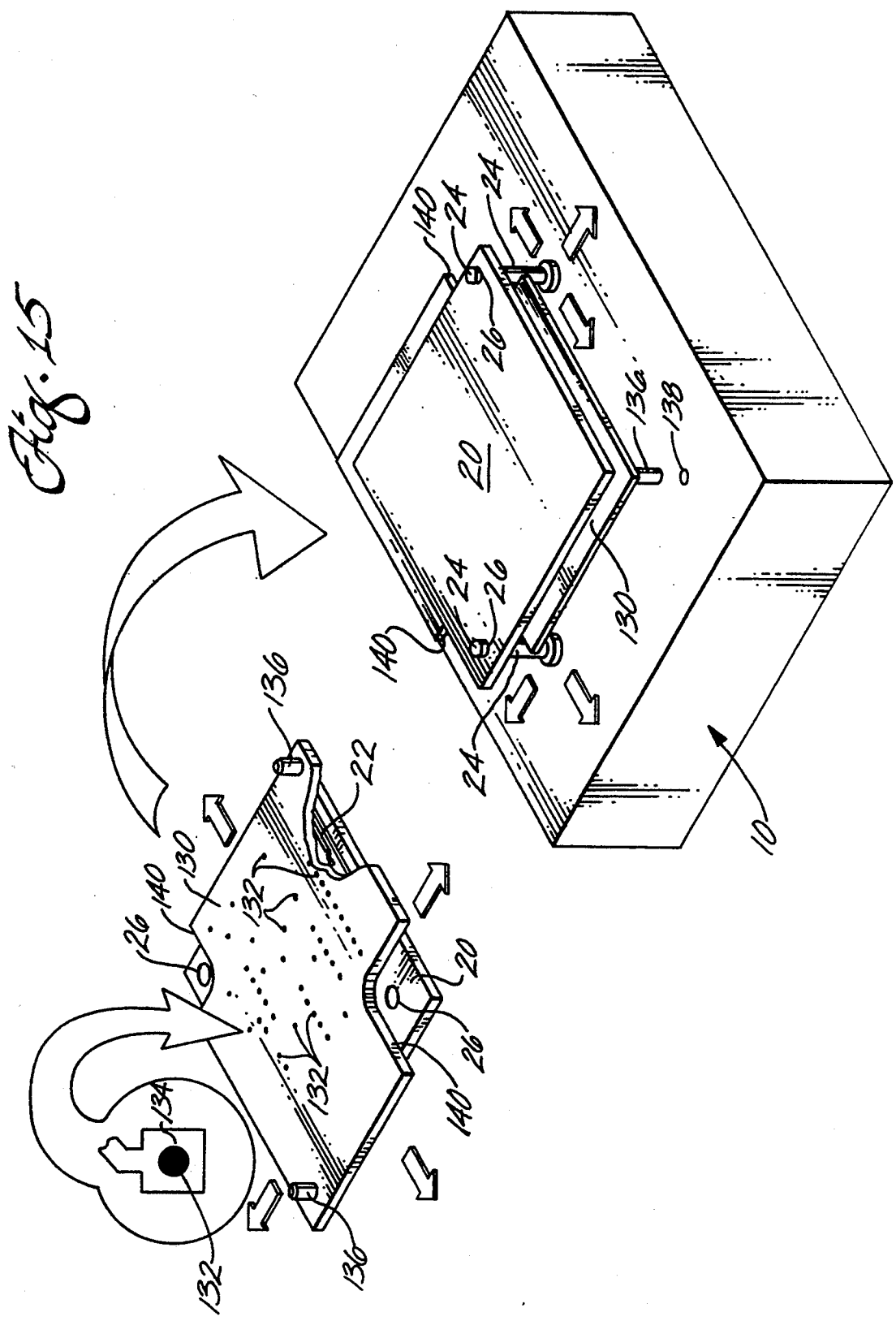
FIG. 15 is a perspective view illustrating an alternative technique for aligning a circuit board with a test fixture.

FIG. 15 shows another embodiment of the invention which provides a system for aligning circuit boards to the test fixture without use of the optical sensing means and means for producing enlarged images of a fiducial mark and a cross-hair or other zero reference point. In the illustrated system, an indexing or reference board 130, similar to the gold board described previously, is produced to represent a board perfectly aligned to the test fixture. The reference board 130 has a pattern of indexing marks 132 representing locations of the test points in the circuit array on a board under test. A circuit board 20 to be tested is aligned with the reference board so that test points 134 in the circuits on the board under test are matched to or overlie the test points 132 printed on the reference board. Preferably, the reference board is transparent so that the test points of the board 20 can be viewed through the reference board to align the test points 132 of the reference board with the corresponding test points 134 of the circuits on the board under test. The two overlying boards are then affixed to one another to prevent relative movement between them. The reference board also has tooling pins 136 or other alignment means related accurately to the test points 132 on the reference board. The reference board tooling pins are positioned accurately on the reference board so that when the tooling pins 136 are aligned with tooling pin holes 138 in the fixture, the reference board alignment will represent a circuit board accurately aligned to the field of test probes on the fixture. The reference board also includes cut out regions 140 in diagonally opposite corners that correspond to location of the movable tooling pins 24 on the fixture. The left side of FIG. 15 shows the transparent reference board 130 overlaid on a circuit board 20 being tested, in which the test points 132 of the reference board are visually aligned with corresponding test points 134 in the circuits on the board under test. When the two boards are perfectly aligned and the two boards are fastened together to prevent relative movement, the two boards are then flipped over and mounted to the fixture as shown in the right side of FIG. 15 (in which the circuit board 20 and the reference board 130 are shown separated for clarity). The reference board is mounted to the fixture by inserting the tooling pins 136 of the reference board in the correctly aligned tooling pin holes 138 in the fixture. If there is any misalignment between the tooling pin holes 26 of the board under test and the artwork on the board, then the tooling pins 24 in the fixture will not accurately register with the tooling pin holes 26 on the board under test. In this event, the tooling pins 24 are loosened and moved to positions which will correctly register the tooling pins 24 with the tooling pin holes 26. The cut out regions 140 provide clearance for moving the tooling pins 24 to their aligned positions. After the circuit board is aligned to the test fixture, the reference board 130 can be removed, and all boards within the same lot can then be tested on the test fixture using the same tooling pin positions.

In the embodiment of the invention described previously, the board 20 is mounted on tooling pins 24 which are independently movable relative the top plate 16, by adjusting the position of the tooling pins on the probe plate 25. Alternatively, the same adjustment (of the board relative to the probe field) can be made by mounting the board on tooling pins rigidly affixed to the top plate and moving the top plate and the board in unison relative to the probes on the lower probe plate. Board movement is in a plane parallel to the probe plate and the top plate. The top plate can be moved to the correct position by an external motor drive that moves the board while the operator views the images of the fiducial marks and the fixed reference points set by the calibration techniques described previously. In the following description, a presently preferred X-Y axis motor drive for moving the top plate will be described, although other systems for moving a top plate and its fixed tooling pins can be used without departing from the scope of the invention.

Figure 16:
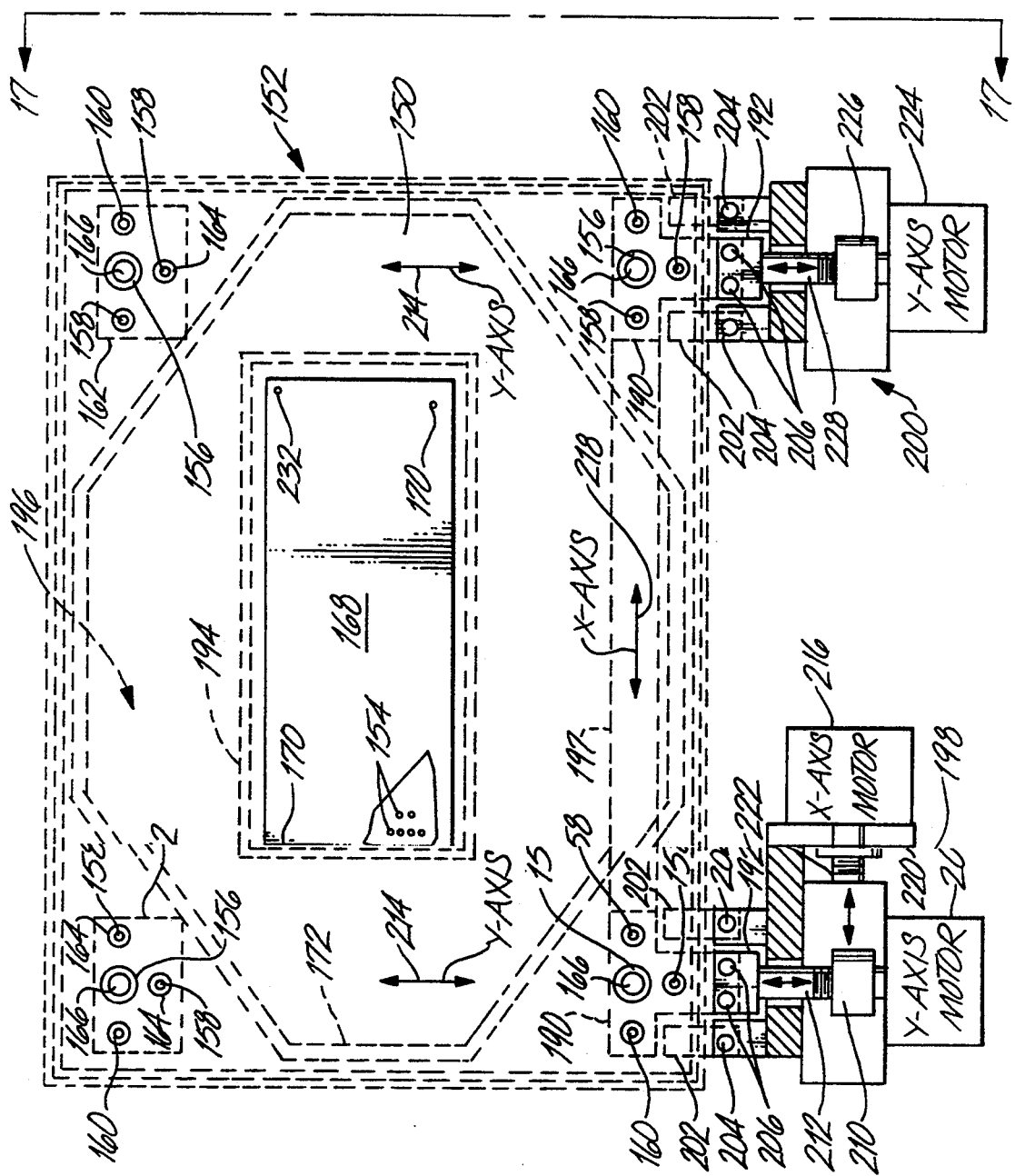
FIG. 16 is a schematic top view showing an X-Y axis motor drive for use in aligning the top plate of the test fixture in response to position adjustment information from an optical alignment system.
Figure 17:
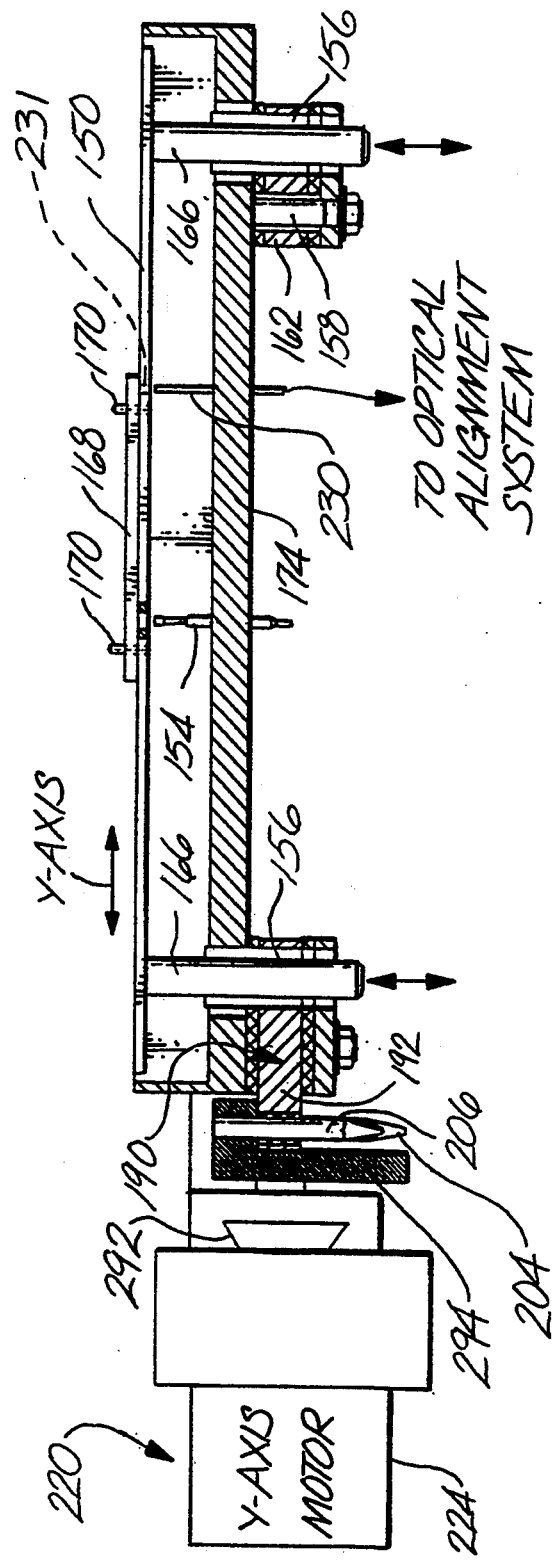
FIG. 17 is a schematic cross-sectional side view taken on line 17—17 of FIG. 16.
Figure 18:
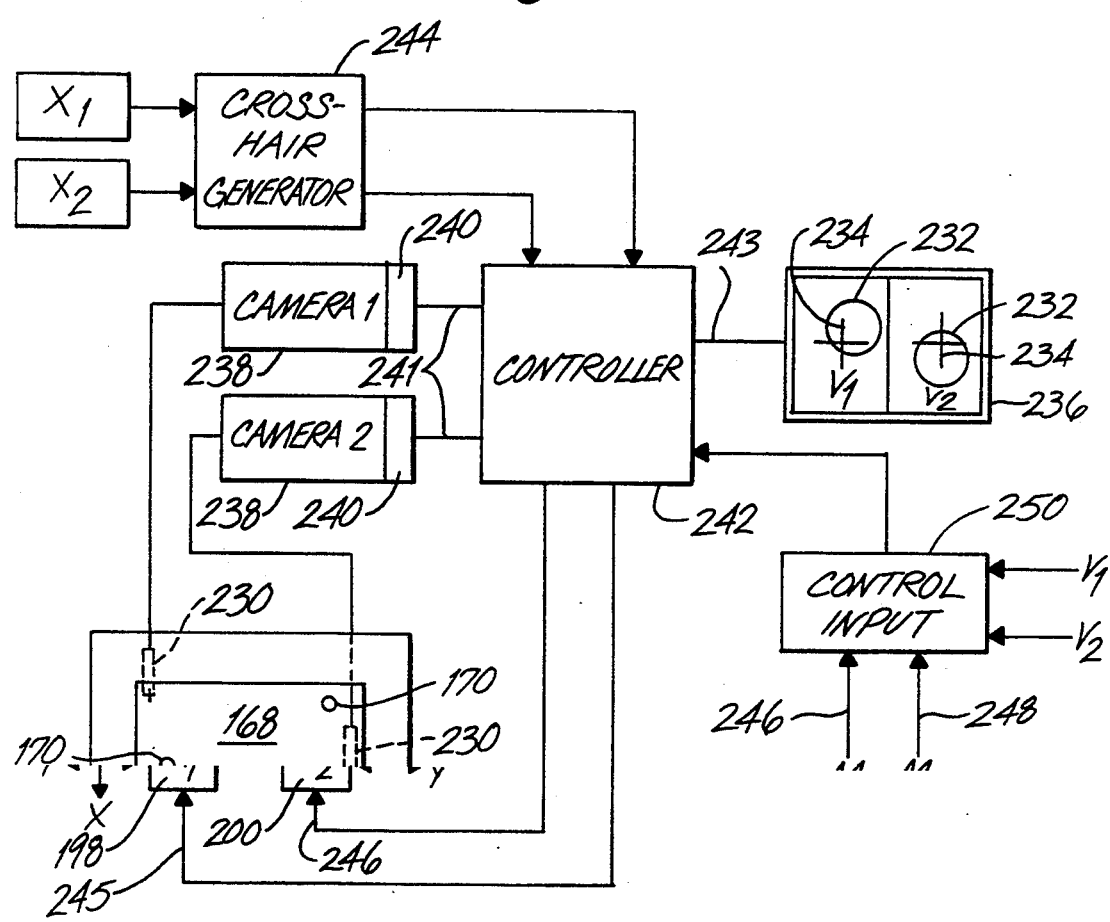
FIG. 18 is a schematic functional block diagram illustrating electronic components of the test fixture alignment imaging system and motor drive for automatically providing the alignment.

FIGS. 16 to 24 illustrate one embodiment of an X-Y axis motor drive system for automatically shifting a top plate 150 into correct alignment with the probe field on a test fixture 152 so that circuits on the board under test will be correctly aligned with the test probes 154. Any misalignment of the board relative to the probe field is sensed by an optical alignment system such as that described above. FIGS. 16 through 18 schematically illustrate one embodiment of the test fixture and a linear bearing system used in cooperation with an embodiment of the optical alignment system. The bearing system shown for purposes of illustration is similar to that described in application Ser. No. 07/896,479, filed Jun. 9, 1992, entitled "Test Fixture." That application is owned by the assignee of this application and is incorporated herein by this reference. The linear bearing system includes movable bearing blocks at the four corners of the fixture. Each bearing block includes a linear bearing sleeve 156 and fasteners 158 for being loosened to allow the freedom of movement of the bearing blocks while the top plate 150 is shifted during use of the optical alignment system. Each bearing block also is shown with a locking pin 160 for use in pinning the bearing blocks to hold the alignment after the top plate is moved and the board under test is correctly aligned to the probe field by the optical alignment system.

Figure 21:
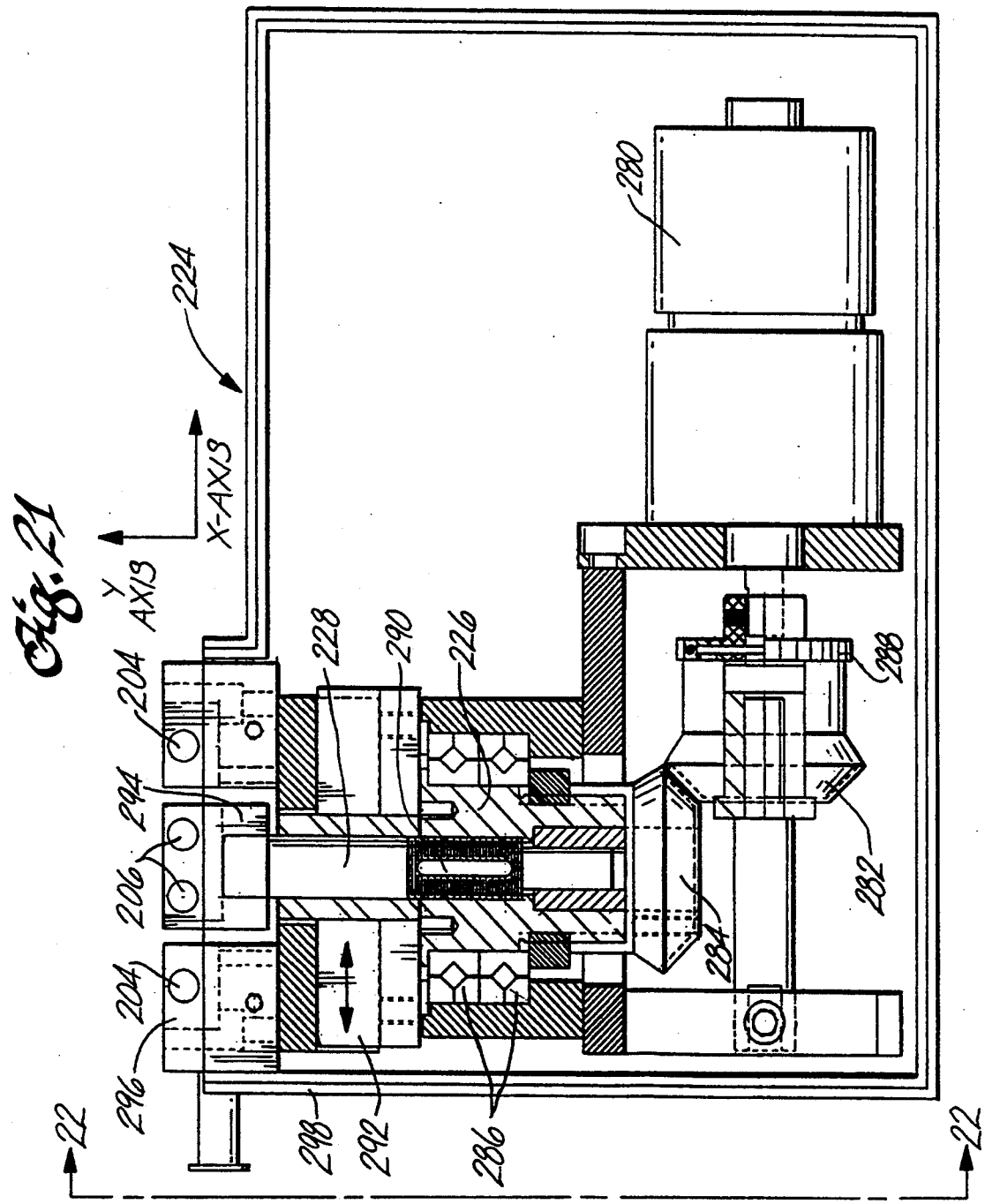
FIG. 21 is a semi-schematic cross-sectional view showing a Y-axis motor drive.

Briefly, the fixture includes bearing blocks 162 at the rear corners of the fixture. FIG. 21 also shows fittings 164 and the shaft 166 that slides vertically in each bearing. The board under test 168 is shown mounted to the top plate 150 on fixed tooling pins 170. A separate pair of bearing blocks 190 at the front corners of the fixture are modified to include an extension arm 192 coupled to separate drive motors for use in automatically moving the top plate into alignment as described below. The bearing blocks 190 are otherwise similar to the rear bearing blocks 162 in that they include the fasteners 158 for allowing freedom of movement of the bearing block relative to the top plate; and they also include the linear bearing 156 and shaft 166, as well as the pins 160 for use in pinning the front bearing blocks when the optical alignment has been completed.

The system shown in FIG. 16 also includes the annular outer gasket 172 which provides an outer seal between the underside of the moving top plate 150 and the top of the probe plate 174. As described previously, this vacuum seal isolates the vacuum area from the movable bearing blocks which are outside the vacuum area. In the embodiment illustrated in FIG. 16, the printed circuit board 168, which is mounted to the top of the top plate 150, is also isolated in its entirety from the vacuum area. In this embodiment, a vacuum seal 194 made of a material similar to the seal 172 is secured to the underside of the moving top plate. The bottom of the seal 194 fits into a shallow recess of matching configuration in the upper surface of the probe plate. When a vacuum is drawn, an annular vacuum area 196 is formed between the seal 194 and the seal 172 so that the circuit board under test is completely isolated from the vacuum area.

Referring now to the optical alignment system, and particularly with reference to FIGS. 16 and 17, a pair of hand-held drive motors are attached to the extension arms 192 of the bearing blocks 190 at the front corners of the fixture for use in automatically shifting the alignment of the top plate relative to the test probes on the fixture base. The front bearing blocks 190 are rigidly affixed to a rigid transverse bar 197 which extends laterally across the front of the fixture below the probe plate 174. The bearing blocks 190 are mounted between Teflon slide sheets so the front bearing blocks 190 and the transverse bar 197 are tied together as a rigid unit and move in unison relative to the top plate. The attachment of the bearing blocks to the fixture base allows for vertical sliding travel of the top plate in the plane of the top plate only, while motion in the vertical direction or rocking motion of the top plate is prevented. As mentioned previously, the shafts 166 affixed to the bottom of the moving top plate are aligned in the linear bearings 156 so that any movement of the front bearing blocks will automatically move the top plate. The bearing blocks 162 at the rear corners of the fixture remain in a loosened condition during optical alignment, and the shafts 166 on the moving top plate which are engaged with the linear bearings in the rear bearing blocks are idle and follow the travel induced on the front bearing blocks by the optical alignment drive system. The extension arms 192 of the front bearing blocks are driven during the alignment process by an X-axis, Y-axis drive motor 198 in cooperation with a Y-axis drive motor 200. Each of these drive motors is contained within a separate hand-held housing adapted to be releasably connected to the front corners of the fixture prior to the optical alignment process. The narrow extension arm 192 from each front bearing block extends between a pair of fixed outer extension arms 202 rigidly affixed to the probe plate. The outer fixed arms 202 extend parallel to the movable arms 192 on the front bearing blocks which extend into the space between the outer extension arms 202. The outer fixed extension arms have vertically extending fixed pins 204 (described below) on the drive motors for connecting to corresponding receptacles on the fixture holding the drive motors in a fixed position at the front corners of the fixture during the alignment process. The fixed pins 204 on the drive motors can be removed from these receptacles when removing the motors from the front corners of the fixture. The extension arms 192 of the movable front bearing blocks are connected to a pair of vertically extending movable pins 206 that connect to receptacles on a movable carriage (described below) carried by the X-Y axis drive shafts of the drive motors 198 and 200. The alignment process using the drive motors is described in more detail below.

Referring now to the schematic representations of the drive motors 198 and 200 shown in FIG. 16, the X-axis, Y-axis drive motor 198 includes a Y-axis motor 208 having an internally threaded drive nut 210 which is rotated about its axis when the Y-axis motor 208 is driven. The drive nut 210 is engaged with an externally threaded fixed Y-axis shaft 212 rigidly affixed to the extension arm 192 of the bearing blocks shown at the front left corner of the fixture. When the Y-axis motor is driven, the drive nut 210 causes the Y-axis shaft 212 to move axially in the Y-axis direction shown at 214 in FIG. 16. The drive unit 198 also includes an X-axis motor 216 having an output shaft aligned on the X-axis shown at 218, at a right angle to the Y-axis shaft. The X-axis motor includes a drive nut 220 internally threaded and engaged with an X-axis fixed shaft 222 connected through internal gearing (described below) that causes the top plate to shift in the appropriate direction along the X-axis when the X-axis motor drives the drive nut 220.

The Y-axis drive unit 200 includes a Y-axis motor 224 for driving a Y-axis drive nut 226 connected to a fixed Y-axis shaft 228 affixed to the bearing block shown at the right front corner of the fixture.

During operation of the optical alignment system, as described in more detail below, the top plate can be moved in the X-axis, Y-axis, or can be rotated in the Z-axis as follows. Any alignment in the X-axis is produced by operating the X-axis motor 216 which will move the front extension arm 192 of the bearing blocks shown at the front left corner of the fixture. The entire top plate is affixed as a rigid unit to the X-axis drive so that input signals to the controller for the X-axis motor can drive the top plate to the left or right along the X-axis. Y-axis motion is produced by operating the Y-axis motors 208 and 224 in unison to move the top plate toward the front or toward the rear along the Y-axis 214. The Y-axis drive motors 208 and 224 also can be operated to produce Z-axis (rotational) motion of the top plate by rotating one Y-axis motor in one rotational direction and by rotating the other Y-axis motor in the opposite rotational direction. Corresponding input signals to the Y-axis motors can produce counterclockwise or clockwise rotation of the top plate in addition to forward or rear motion purely along the Y-axis.

Referring to FIG. 18, the optical alignment system, in a preferred form, includes a narrow diameter bore scope 230 (shown schematically in FIG. 18 and shown in position in the fixture in FIG. 17). The bore scope includes an optical fiber image guide for transmitting the image of a fiducial mark 232 on the board to a remote processing unit. The bore scope also includes optical fibers for transmitting light from a remote light source to the vicinity of the fiducial mark so that the fiducial mark can be illuminated. This enhances the image of the fiducial mark transmitted by the optical fiber image guide. The probe end of the bore scope is mounted in a fixed position on the probe plate 174 beneath the movable top plate 150. The probe has access to the fiducial mark through an opening 231 in the top plate 150. There are actually two bore scopes used, a separate one for imaging each fiducial mark 232, in diagonally opposite corners of the fixture. A small size diameter receptacle, preferably a standard 0.080 inch connector, mounts each bore scope to the probe plate. The moving top plate includes the fixed tooling pins 170 inserted into tooling pin holes in diagonally opposite corners of the board 168 under test. The tooling pins are rigidly affixed to the top plate and they hold the board in a fixed position above the top plate.

In use, the bore scope senses the position of each fiducial mark and produces an optical reading showing any misalignment of each fiducial mark relative to known zero reference point, shown at 234 on the screen of a monitor 236. Preferably, the images transmitted by each bore scope are input to separate miniature video cameras 238 located remotely from the test fixture. The video camera lens systems focus the transmitted images of the fiducial marks on a charge-coupled device (CCD) chip located at 240 in each remote video camera unit. The (CCD) converts the image from the video lens system into digital signals 241 processed by a video display system which includes a camera controller unit (CCU) in a controller 242. A coaxial video cable 243 transmits video signals to the TV monitor 236. Enlarged images of the fiducial marks are produced on the screen of the video monitor. The screen is split so that two screen sections $V_1$ and $V_2$ display each fiducial mark 232 in comparison to a corresponding fixed reference point 234 generated by a cross-hair generator 244. The calibration procedures for setting the fixed reference points are described above. The output of the electronic cross-hair generator 244 is electronically coupled to the video cable and also displayed as the fixed reference points on the screen. Movement of the board causes the images of the fiducial marks to change on the screen relative to their corresponding fixed reference points. Any movement of the board relative to the probe field is displayed as a misalignment of the fiducial marks with respect to their fixed reference points. By moving the board relative to the probe plate (and therefore relative to the bore scopes), the images of the fiducial marks can be aligned with the fixed reference points. This automatically aligns the board with the probe field. In this embodiment, the tooling pins 170 of the top plate remain fixed and they, along with the board and the top plate, move in unison relative to the probe plate and the bore scopes.

As mentioned previously, the linear bearings of this invention provide a means for shifting movement of the top plate 28 with 360° freedom of movement during the optical alignment process. The linear bearings are retained in their loosened position during optical alignment procedures. In a preferred form of the invention, the moving top plate is shifted by the X-Y axis motor drive unit 198 and the Y-axis motor drive unit 200. Each drive unit is computer controlled to automatically move the top plate into correct alignment with the probe field. During use, the operator of the alignment system observes the relative alignments of the fiducial marks 232 with respect to the fixed reference points 234 and operates the motor drive units 198 and 200 to move the top plate until the fiducial marks and their corresponding fixed reference points are aligned. The motor drive units 198 and 200 are driven by control signals 245 and 246, respectively, output from the controller 242. Either or both of the motor drive units are driven in response to motor drive commands 246 and 248 input to a control unit 250. The motor drive systems will now be described.

Figure 19:
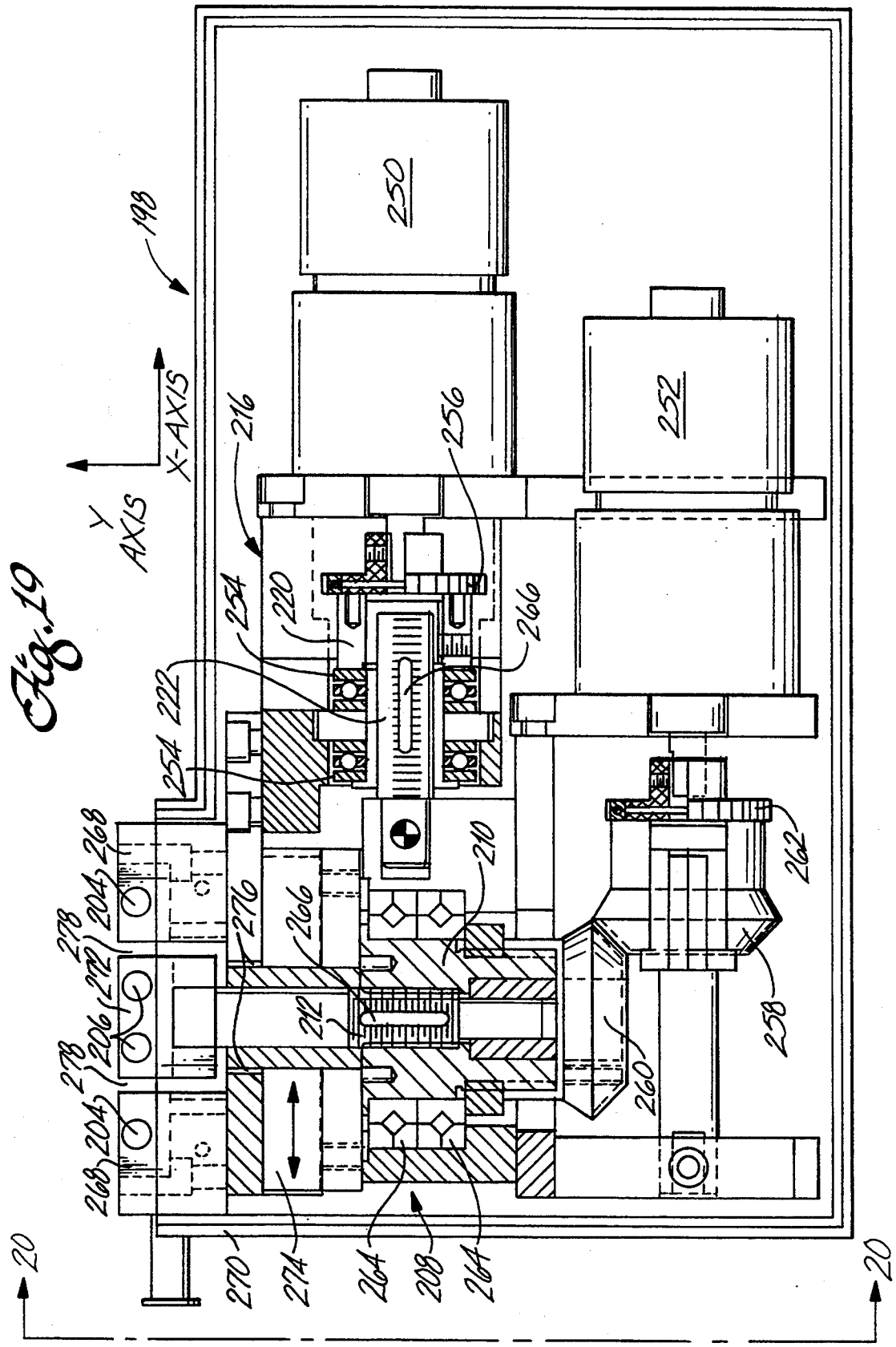
FIG. 19 is a semi-schematic cross-sectional view of an X-Y axis motor drive.
Figure 20:
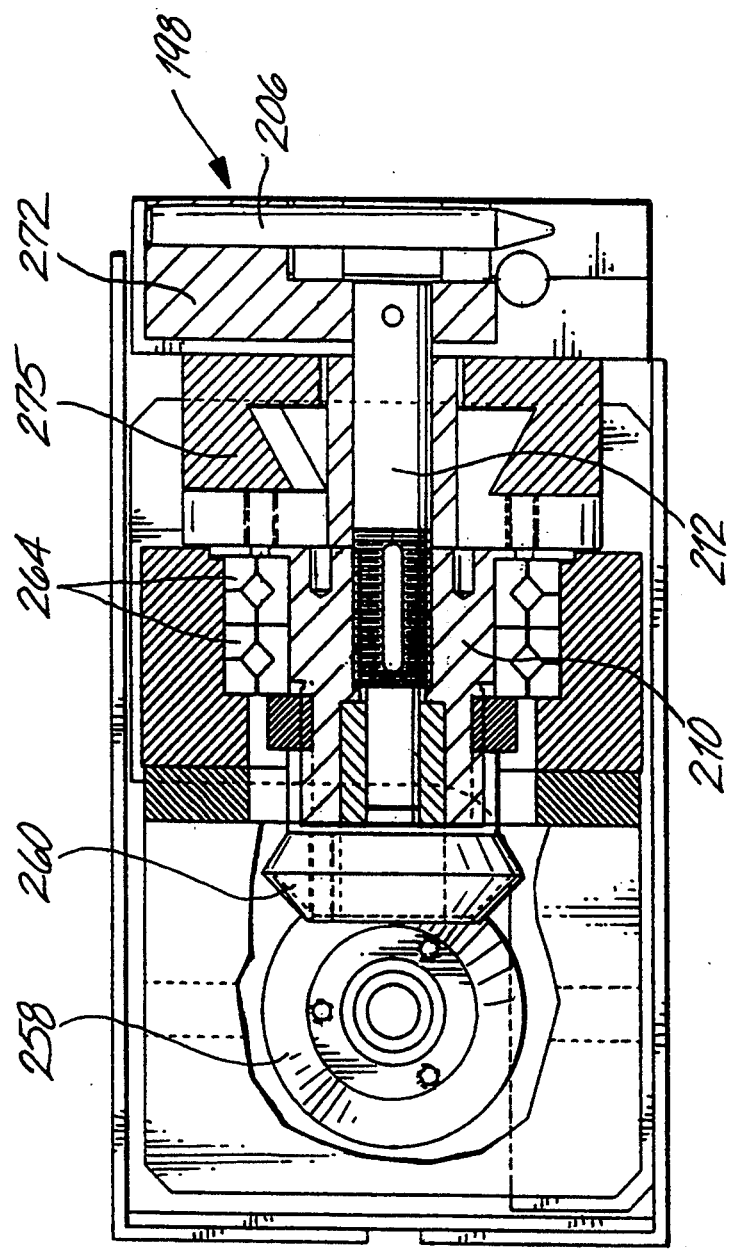
FIG. 20 is a semi-schematic cross-sectional view of the X-Y axis motor drive taken on line 20—20 of FIG. 19.

FIGS. 19 and 20 show the X-Y axis drive unit 198 which includes and X axis gear motor 250 and a Y axis gear motor 252. The X axis gear motor rotates the X axis drive nut 220. Thrust bearings 254 adjusted to zero clearance keep the drive nut 220 in a fixed position as it rotates about its axis. The screw-threaded X-axis shaft 222 is held in a fixed position without rotation. A flexible drive coupler 256 absorbs start-up and end-of-travel shock. Rotation of the X-axis drive nut moves the X-axis shaft 222 axially back and forth along the X axis.

The Y-axis gear motor 252 is coupled to the Y-axis drive nut 210 through right angle gears 258 and 260. A Y-axis flexible drive coupler is shown at 262. The gear 260 has its output shaft coupled to the Y-axis drive nut supported by zero clearance radial bearings 264. Rotation of the Y-axis drive nut moves the Y-axis shaft 212 axially toward or away from the drive nut in opposite directions along the Y axis. Anti-backlash segments 266 are carried on both the threaded shafts of the X and Y drive units.

Fixed mounting brackets 268 are spaced apart on opposite sides of the Y-axis shaft 212. The fixed brackets are rigidly affixed to the drive unit housing 270 and these mounting brackets carry the fixed pins 204 described previously. These pins 204 are used to mount the drive unit 198 to the front corner of the fixture. A movable pin mounting bracket 272 is carried on the end of the Y-axis shaft 212 between the two fixed mounting brackets 268. As the Y-axis shaft is moved in or out along the Y axis, the movable bracket 272 moves linearly with movement of the shaft 212. The movable bracket 272 carries the moving pins 206, described previously, which are connected to the bearing blocks at the front corners of the fixture.

The X-axis shaft 222 is rigidly affixed to a carriage 274 for translating the Y-axis shaft laterally in the X-axis direction during translation of the X-axis shaft 222. The carriage 274 includes a dovetail slide 275 which constrains the moving pin block 272 to movement only in the X axis. Clearance at 276 allows for translation of the Y-axis shaft 212 and its moving pin bracket 272 during alignment adjustments along the X-axis. Clearance at 278 between the moving pin bracket 272 and the fixed pin brackets 268 also allow for movement along the X axis.

Figure 22:
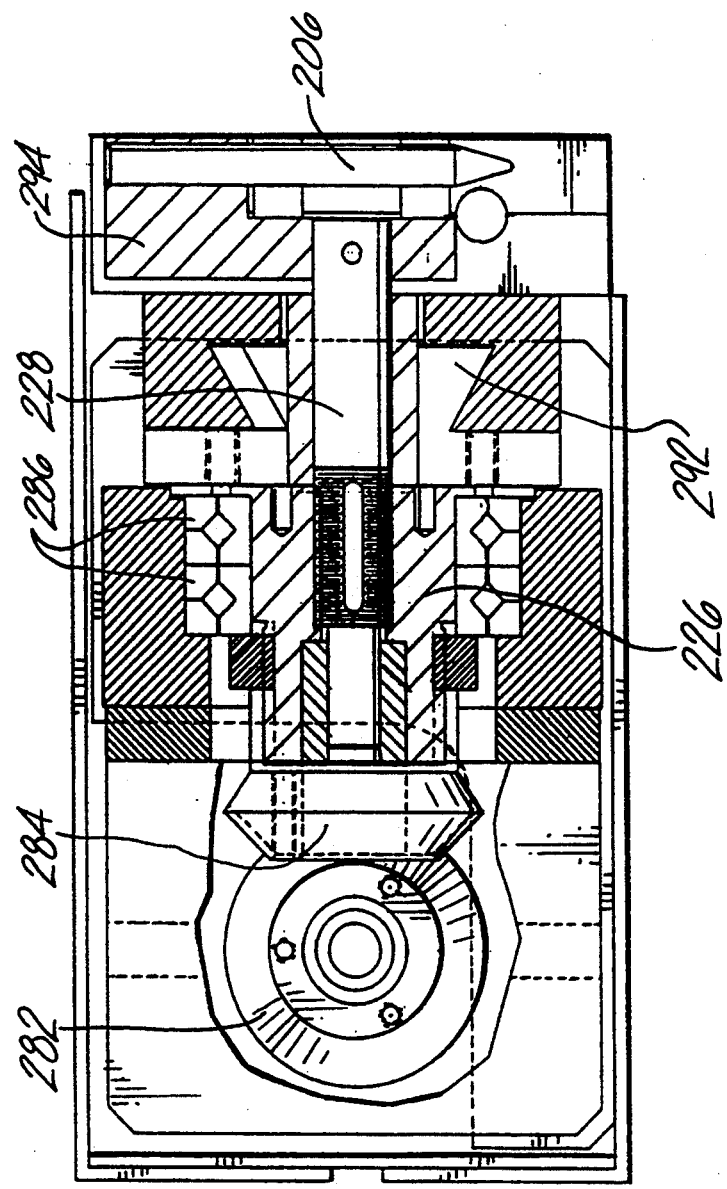
FIG. 22 is a semi-schematic cross-sectional view, partly broken away, showing a Y-axis motor drive taken on line 22—22 of FIG. 21.

Referring to FIGS. 21 and 22, the Y-axis drive motor 224 includes a Y-axis gear motor 280 having its output shaft coupled to the Y-axis drive nut 226 through intervening right angle gears 282 and 284. The drive unit also includes the zero clearance radial bearings 286, flexible drive coupler 288, and anti backlash segment 290 described previously. The Y-axis drive shaft 228 is carried on a dovetail slide 292 that allows free movement in the X axis while restricting Y-axis travel when the moving pin block 294 is driven in the X-axis direction. Fixed pin blocks 296 affixed to the housing 298 for the Y-axis drive carry the fixed mounting pins 204. The movable pin block 294 carries the pins 206 for connection to the bearing block at the right front corner of the fixture.

Figure 23:
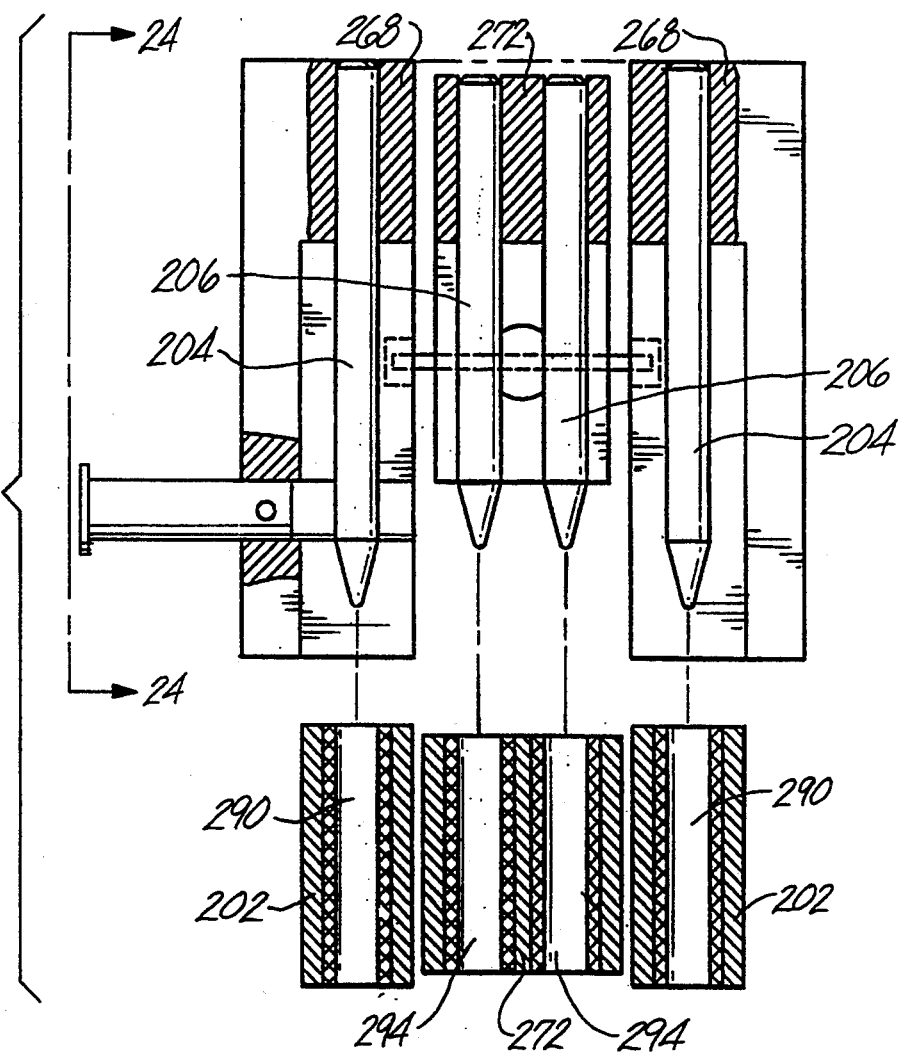
FIG. 23 is a cross-sectional view showing a means for mounting a motor drive unit to a movable top plate of the fixture for use in shifting the top plate during an optical alignment procedure.
Figure 24:
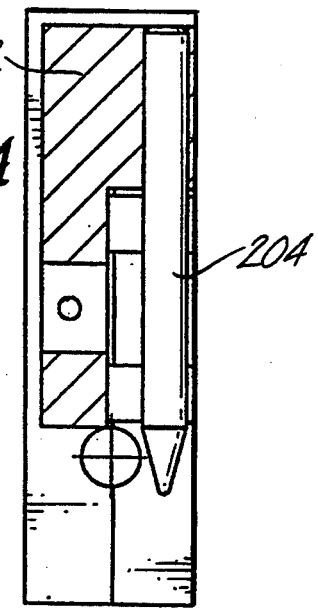
FIG. 24 is a cross-sectional view taken on line 24—24 of FIG. 23.

In using the motor drives, each drive unit is mounted to a corresponding extension arm on the bearing blocks at the front corners of the fixture. FIGS. 23 and 24 illustrate the means for releasably mounting each drive unit to the bearing block. As mentioned previously, the fixed pins 204 of the fixed pin mounting bracket 268 are inserted into corresponding receptacles 290 in a fixed mounting block 202 rigidly affixed to the front of the fixture base. This holds each drive unit in a fixed position relative to the fixture. The drive unit also includes the movable pins 206 carried on the movable pin holder 272 which is driven in the X or Y axis by the drive unit. The pins 206 are inserted into long narrow receptacles 294 in the extension arm 272 of the bearing block at the corner of the fixture. All four pins 204, 206 are inserted into their corresponding receptacles 290, 294, respectively, simultaneously. Thus, when the drive unit is mounted to the front corner of the fixture, the drive unit is held in a fixed position relative to the fixture by the outer pins 204, while the drive units are able to move the top plate in the X, Y or Z directions by the attachment of the pins 206 to the bearing blocks at the front corners of the fixture.

In the alignment process, the drive motors are attached to the front corners of the fixture, the optical alignment system is used to observe any misalignment of the board relative to the probe field, followed by operating the drive motors to shift the top plate until the optical alignment system indicates proper alignment. The drive units then can be removed from the fixture followed by adjustment of the locking pins 160 for holding the linear bearings at the four corners of the fixture in a fixed position relative to the moving top plate. The fixture is then ready for vacuum actuation to test the circuit board.

In an alternative form of the invention the X and Y axis shafts can be rotated manually to move the top plate. This can be achieved by providing manually rotatable knobs on the drive motor housings that turn the drive nut for moving the cooperating screw-threaded shaft in the appropriate lineal direction.

What is claimed is:

1. In a test fixture for testing printed circuit boards and the like, the test fixture being of the type having a board mounting plate, an array of test probes mounted on a probe plate for contact with a pattern of test points in a printed circuit array on the board, the circuit array being positioned on the board with reference to a fiducial mark on the board, the board also having an alignment device positioned thereon in alignment with the circuit array, the improvement comprising:

a tooling pin rigidly affixed to the board mounting plate for engaging the alignment device on the board to hold the board and its circuit array in a fixed position relative to the array of test probes on the probe plate;

sensing means mounted in a fixed position for sensing the position of the fiducial mark as the board moves relative to the sensing means and the array of test probes to produce an output representative of the alignment or misalignment of the array of test probes relative to the circuit array on the board; and drive means for moving the board mounting plate relative to the probe plate and the test probes for thereby moving the circuit board relative to the fixed sensing means to correct any misalignment of the circuit array relative to the array of test probes, the sensing means producing said output to indicate the precise movement of the board mounting plate to an adjusted position relative to the probe plate necessary to align the sensing means with the fiducial mark to thereby indicate precise alignment of the test probes with corresponding test points in the circuit array on the board;

the drive means comprising an X-axis drive motor and a Y-axis drive motor each having an output shaft coupled to the board mounting plate to produce X and Y-axis travel of the board mounting plate, and further drive means to produce Z-axis rotational motion of the board mounting plate to move the circuit board relative to and generally parallel to the fixed probe plate and the sensing means to thereby correct said misalignment.

2. The improvement according to claim 1 in which the means for moving the board includes means for stopping board movement to retain the board in the adjusted position during testing of the circuits on the board.

3. Apparatus according to claim 1 in which the sensing means comprises an optical fiber sensor for producing an optical image of the fiducial mark.

4. Apparatus according to claim 3 in which the sensing means includes a lens, and further including a video probe assembly responsive to an image formed by the lens for displaying an enlarged image of the fiducial mark on a video monitor.

5. Apparatus according to claim 1 in which the sensing means comprises a lens system and video probe, and said output is produced by means converting an image of the fiducial mark to an enlarged video image representative of said alignment or misalignment.

6. Apparatus according to claim 5 in which an enlarged image of the fiducial mark is displayed on a video monitor for comparison with an adjustable indexing mark electronically produced on the monitor to indicate the correct alignment position of the probes relative to the circuit array.

7. A test fixture for testing printed circuit boards and the like, the test fixture being of the type having a board mounting plate, an array of test probes mounted on a probe plate for contact with a pattern of test points in a printed circuit array on the board, the circuit array being positioned on the board with reference to a fiducial mark on the board, the board also having an alignment device positioned thereon in alignment with the printed circuit array, the test fixture including:

a tooling pin rigidly affixed to the board mounting plate for engaging the alignment device on the board to hold the board and its circuit array in a fixed position relative to an array of test probes on the probe plate;

optical fiber sensing means mounted in a fixed position on the probe plate for sensing the fiducial mark on the board and producing an image that represents the position of the fiducial mark;

means for producing a fixed reference point that represents a fixed reference position with which the image of the fiducial mark position can be aligned to thereby align the array of test probes with the pattern of test points on the board; and drive means for moving the board mounting plate relative to the probe plate and the test probes for thereby moving the board relative to the fixed sensing means to correct any misalignment of the circuit array relative to the array of test probes, the sensing means producing said output to indicate the precise movement of the board mounting plate to an adjusted position relative to the probe plate necessary to align the sensing means image of the fiducial mark with the fixed reference point to thereby indicate precise alignment of the test probes with corresponding test points in the circuit array on the board;

the drive means comprising an X-axis drive motor and a Y-axis drive motor each having an output shaft coupled to the board mounting plate to produce X and Y-axis travel of the board mounting plate, and further drive means to produce Z-axis rotational motion of the board mounting plate to move the circuit board relative to and generally parallel to the fixed probe plate and sensing means to thereby correct said misalignment.

8. Apparatus according to claim 7 in which each drive motor is stopped to hold the board in the fixed adjusted position during testing.

9. Apparatus according to claim 7 in which the optical fiber sensing means comprises a bore scope having its optical output remotely coupled to video means for displaying an enlarged image of the fiducial mark.

10. Apparatus according to claim 7 in which the means for producing the fixed reference point comprises means for forming an adjustable image electronically produced on a monitor to indicate correct alignment of the probes relative to the circuit array on the board.

11. Apparatus according to claim 7 in which the optical fiber sensing means includes:
a lens for forming an image of the fiducial mark, and an optical fiber image conduit for transmitting the image, the lens and image conduit being removably mounted to the fixture; and including video means responsive to the transmitted image for displaying an enlarged image of the fiducial mark relative to the second image for indicating correct aligned position of the test points relative to the test probes.

12. A method for the diagnostic testing of printed circuit boards on a test fixture of the type having a board mounting plate, an array of test probes mounted on a probe plate for contact with a pattern of test points in a printed circuit array on a board under test, wherein the circuit board under test is held in pressure contact with the test probes to provide electrical contact between diagnostic testing equipment external to the fixture and the circuits on the board under test, the circuit array being positioned on the board with reference to a fiducial mark on the board, the board also having an alignment device positioned thereon for alignment with the circuit array, the method comprising:
aligning a tooling pin on the board mounting plate with the alignment device on the board to hold the board and its circuit array in a fixed position relative to the probe plate and the pattern of test probes on the probe plate;
mounting an optical sensing means to a fixed position relative to the probe plate for producing an image of the fiducial mark on the board which is held by the tooling pin;
mounting X-axis and Y-axis drive motors to the board mounting plate, the drive motors being operative to move the board mounting plate and the circuit board in X and Y-axis movements and Z-axis rotational movements relative to the probe plate and its array of test probes;
producing a reference image of a fixed reference point that represents a known correct position with which the fiducial mark image can be aligned to correctly align the array of test probes with the pattern of test points on the board; and
operating the X-axis and Y-axis drive motors for adjusting the position of the board mounting plate relative to and generally parallel to the fixed probe plate to thereby move the board relative to the test probes and the fixed position of the optical sensing means to align the image of the fiducial mark with the reference image and thereby correctly align the array of test probes with the pattern of test points on the board, including electronically producing an optical image of the fixed reference point on a monitor and operating the drive motors to align an image of the fiducial mark on the monitor with the fixed reference point to produce said correct alignment.

13. The method according to claim 12 in which the optical sensing means comprise an optical fiber image sensor for producing an enlarged image of the fiducial mark conveyed by the optical fiber sensor and displayed on a monitor.

14. The method according to claim 12 including stopping operation of the drive means to rigidly maintain the board mounting plate in the correctly aligned position.

15. The method according to claim 12 including calibrating the position of the optical sensing means relative to a fiducial mark on a calibration board having a known correct position relative to the fixture and producing said reference image in accordance with said calibrated position, prior to operating the drive motor to align the board under test.

16. A test fixture comprising:
a board mounting plate for holding a board under test, the board having an array of test points in a printed circuit aligned on the board with reference to a fiducial mark on the board;
a probe plate having an array of test probes for alignment with the test points in the circuits on the board;
the board mounting plate and probe plate being movable toward each other to provide contact between the test probes and corresponding test points in the circuits on the board;
optical sensing means in a fixed position on the probe plate for sensing the position of the fiducial mark on the board and producing a first image on a monitor to represent the position of the fiducial mark;
means for producing a second image on the monitor representing a fixed reference point with which the first image is aligned to indicate a correct alignment of the test probes and the test points on the board under test; and
an X-axis drive motor and a Y-axis drive motor in which each motor has an output shaft coupled to the board mounting plate to produce X and Y-axis travel and Z-axis rotational motion of the board mounting plate to move the board relative to and generally parallel to the fixed probe plate and thereby align the first and second images to correctly align the test probes with the test points in the circuits on the board under test.

17. Apparatus according to claim 16 in which the X-axis drive motor and the Y-axis drive motor comprise separate motors each releasably attachable to the board mounting plate.

18. Apparatus according to claim 16 in which the means for producing the second image comprises an electronic reference point generator for producing said second image on the monitor.

19. Apparatus according to claim 16 in which the drive motor is coupled to the board mounting plate so that by stopping operation of the drive motor the board mounting plate is rigidly held in a fixed position relative to the probe plate.

* * * * *